(12) United States Patent
Chawla et al.

(10) Patent No.: US 10,032,643 B2
(45) Date of Patent: Jul. 24, 2018

(54) METHOD AND STRUCTURE TO CONTACT TIGHT PITCH CONDUCTIVE LAYERS WITH GUIDED VIAS USING ALTERNATING HARDMASKS AND ENCAPSULATING ETCHSTOP LINER SCHEME

(71) Applicant: Intel Corporation, Santa Clara, CA (US)

(72) Inventors: Jasmeet S. Chawla, Hillsboro, OR (US); Ruth A. Brain, Portland, OR (US); Richard E. Schenker, Portland, OR (US); Kanwal Jit Singh, Portland, OR (US); Alan M. Myers, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/528,736

(22) PCT Filed: Dec. 22, 2014

(86) PCT No.: PCT/US2014/071999
§ 371 (c)(1),
(2) Date: May 22, 2017

(87) PCT Pub. No.: WO2016/105350
PCT Pub. Date: Jun. 30, 2016

(65) Prior Publication Data
US 2017/0330761 A1   Nov. 16, 2017

(51) Int. Cl.
*H01L 21/311* (2006.01)
*H01L 21/768* (2006.01)
(Continued)

(52) U.S. Cl.
CPC ...... *H01L 21/31144* (2013.01); *H01L 21/485* (2013.01); *H01L 21/486* (2013.01);
(Continued)

(58) Field of Classification Search
CPC ............. H01L 21/31144; H01L 21/485; H01L 21/486; H01L 21/76816; H01L 21/76804;
(Continued)

(56) References Cited

U.S. PATENT DOCUMENTS

| 7,339,271 B2 | 3/2008 | Morrow et al. |
| 7,538,434 B2 | 5/2009 | Shih et al. |

(Continued)

OTHER PUBLICATIONS

Notification of Transmittal of the International Search Report and the Written Opinion for PCT/US2014/071999, dated Sep. 22, 2015, International Filing Date Dec. 22, 2014, 11 pages.

*Primary Examiner* — Alexander Oscar Williams
(74) *Attorney, Agent, or Firm* — Schwabe, Williamson & Wyatt, P.C.

(57) ABSTRACT

Interconnect structures having alternating dielectric caps and an etchstop liner for semiconductor devices and methods for manufacturing such devices are described. According to an embodiment, an interconnect structure may include an interlayer dielectric (ILD) with a first hardmask layer over a top surface of the ILD. The interconnect structure may also include one or more first interconnect lines in the ILD. A first dielectric cap may be positioned above a top surface of each of the first interconnect lines. Additional embodiments include one or more second interconnect lines in the ILD that are arranged in an alternating pattern with the first interconnect lines. A second dielectric cap may be formed above a top surface of each of the second interconnect lines. Embodiments may also include an etchstop liner that is formed over top surfaces of the first dielectric caps.

25 Claims, 16 Drawing Sheets

(51) Int. Cl.
*H01L 21/48* (2006.01)
*H01L 23/522* (2006.01)

(52) U.S. Cl.
CPC .. *H01L 21/76804* (2013.01); *H01L 21/76816* (2013.01); *H01L 23/5226* (2013.01)

(58) Field of Classification Search
CPC ............... H01L 23/5226; H01L 21/768; H01L 23/53295; H01L 23/5329; H01L 21/76834; H01L 21/76832; H01L 21/76808; H01L 21/76897; H01L 21/76883; H01L 21/0337
USPC .................................................. 257/774, 773
See application file for complete search history.

(56) References Cited

U.S. PATENT DOCUMENTS

| | | | |
|---|---|---|---|
| 9,054,164 B1* | 6/2015 | Jezewski | H01L 21/76879 |
| 2008/0153283 A1 | 6/2008 | Abdelrahman et al. | |
| 2009/0081864 A1* | 3/2009 | Matz | H01L 21/3148 438/637 |
| 2009/0085120 A1* | 4/2009 | Lu | H01L 21/31144 257/368 |
| 2009/0200683 A1* | 8/2009 | Colburn | H01L 21/76811 257/774 |
| 2010/0038782 A1 | 2/2010 | Yang et al. | |
| 2010/0093168 A1* | 4/2010 | Naik | H01L 21/31144 438/618 |
| 2012/0100717 A1* | 4/2012 | Lii | H01L 21/31144 438/675 |
| 2012/0190191 A1 | 7/2012 | Shih et al. | |
| 2015/0091174 A1* | 4/2015 | Clarke | H01L 23/481 257/770 |
| 2016/0049364 A1* | 2/2016 | Edelstein | H01L 23/5226 257/774 |
| 2017/0263551 A1* | 9/2017 | Bristol | H01L 23/528 |
| 2017/0263553 A1* | 9/2017 | Schenker | H01L 23/5226 |

* cited by examiner

METHOD AND STRUCTURE TO CONTACT TIGHT PITCH CONDUCTIVE LAYERS WITH GUIDED VIAS USING ALTERNATING HARDMASKS AND ENCAPSULATING ETCHSTOP LINER SCHEME

This patent application is a U.S. National Phase Application under 35 U.S.C. § 371 of International Application No. PCT/US2014/071999 filed Dec. 22, 2014, entitled "METHOD AND STRUCTURE TO CONTACT TIGHT PITCH CONDUCTIVE LAYERS WITH GUIDED VIAS USING ALTERNATING HARDMASKS AND ENCAPSULATING ETCHSTOP LINER SCHEME".

FIELD OF THE INVENTION

Embodiments of the present invention relate generally to the manufacture of semiconductor devices. In particular, embodiments of the present invention relate to interconnect structures for semiconductor devices and methods for manufacturing such devices.

BACKGROUND OF THE INVENTION

Modern integrated circuits use conductive interconnect layers to connect individual devices on a chip and/or to send and/or receive signals external to the device. Common types of interconnect layers include copper and copper alloy interconnect lines coupled to individual devices, including other interconnect lines by interconnect through vias. It is not uncommon for an integrated circuit to have multiple levels of interconnections. For example, two or more interconnect layers may be separated from each other by dielectric materials. The dielectric layers separating interconnect levels are commonly referred to as an interlayer dielectric (ILD).

As these interconnect layers are manufactured with interconnect lines having smaller pitches in order to accommodate the need for smaller chips, it becomes increasingly difficult to properly align the vias with the desired interconnect layer. In particular, during manufacturing, the location of the via edges with respect to the interconnect layer or line it is to contact may be misaligned due to natural manufacturing variation. A via however, must allow for connection of one interconnect line of one interconnect layer to the desired underlying layer or line without erroneously connecting to a different interconnect layer or line. If the via is misaligned and contacts the wrong metal feature, the chip may short circuit resulting in degraded electrical performance. One solution to address this issue is to reduce the via size, for example, by making the via narrower. However, reducing the via size results in an increase in resistance and reduces the yield during manufacturing.

DETAILED DESCRIPTION OF THE INVENTION

Described herein are systems that include an interconnect structure that allows for contact formation to tightly pitched interconnect lines and methods of forming such devices. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

Figure 1A:
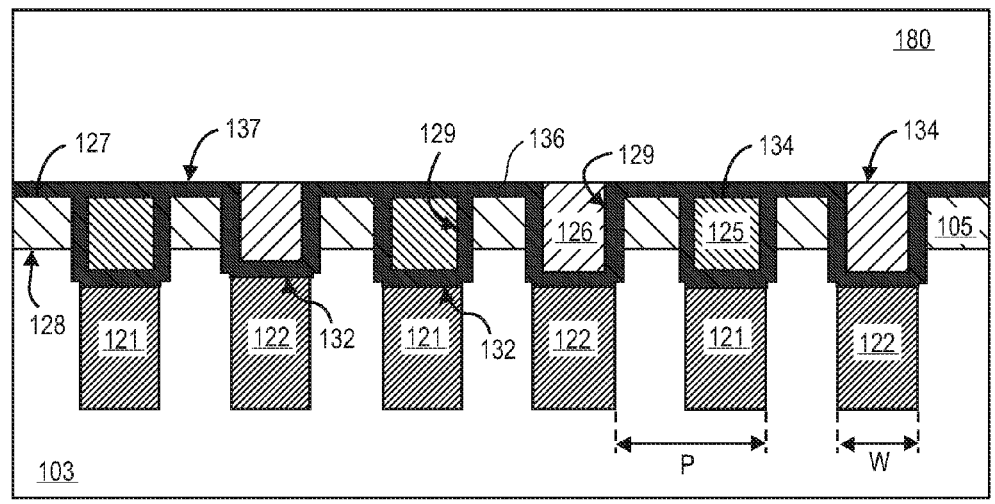
FIG. 1A is a cross-sectional illustration of an interconnect structure that includes an etchstop liner between each dielectric cap and the interconnect line, according to an embodiment.

FIG. 1A is a cross-sectional illustration of an interconnect structure 100 according to an embodiment of the invention. The interconnect structure 100 may be used in conjunction with any semiconductor device that utilizes one or more interconnect layers, such as an IC circuit or the like. Interconnect structure 100 is formed in an interlayer dielectric (ILD) 103. Embodiments of the invention utilize low-k dielectric materials that are typically known in the art for use as ILDs such as, silicon dioxide. According to embodiments of the invention, low-k dielectric materials suitable for formation of the ILD 103 may also include, but are not limited to, materials such as carbon doped silicon dioxide, porous silicon dioxide, or silicon nitrides. Additional embodiments of the invention may include an ILD 103 formed from dielectric materials with k-values less than 5. Embodiments may also include an ILD with a k-value less than 2. According to additional embodiments, the ILD 103 may include air gaps and have a k-value of 1. According to embodiments of the invention, ILD 103 may be less than 100 nm thick. According to additional embodiments, the ILD 103 may be less than 40 nm thick. An additional embodiment of the invention may further include an ILD 103 with a thickness between 40 nm and 80 nm. Additional embodiments include an ILD 103 that is approximately 60 nm thick.

In an embodiment, a first hardmask layer 105 is formed over the top surface of the ILD 103. By way of example, the first hardmask layer 105 may be a dielectric material, such as a nitride or an oxide. According to an embodiment, the first hardmask layer 105 is resistant to an etching process that may be used to etch through a second interconnect layer 180, such as an additional ILD layer used for forming interconnects, that may be formed above the first hardmask layer 105. Embodiments of the invention include a first hardmask layer 105 that is between 3 nm and 10 nm thick.

According to an embodiment, interconnect structure 100 includes first and second interconnect lines 121, 122 formed into the ILD 103 in an alternating pattern, as shown in FIG. 1A. The first and second interconnect lines 121, 122 are formed with conductive materials. By way of example, and not by way of limitation, the conductive materials used to form the interconnect lines may include, Cu, Co, W, NiSi, TiN, Mo, Ni, Ru, Au, Ag, or Pt. In an embodiment, the same conductive material is used to form the first and second interconnect lines 121, 122. According to an alternative embodiment, the first and second interconnect lines 121, 122 are formed with different conductive materials.

The interconnect lines 121, 122 are spaced apart from each other by a pitch P. Embodiments of the invention include high density interconnect lines with a pitch P less than 60 nm. Further embodiments of the invention include a pitch P that is less than 30 nm. Embodiments of the invention include interconnect line widths W less than 30 nm. Additional embodiments of the invention include interconnect line widths W less than 15 nm.

In an embodiment, the first and second interconnect lines 121, 122 are recessed such that top surfaces 132 of the interconnect lines are positioned below a top surface 127 of the first hardmask layer 105. According to an embodiment, the first and second interconnect lines may be recessed such that top surfaces 132 of the interconnect lines 121, 122 are positioned below a bottom surface 128 of the first hardmask layer 105. Recessing the interconnect lines 121, 122 allows for dielectric caps 125, 126 and an etchstop liner 136 to be formed above each of the interconnect lines, according to an embodiment of the invention.

As illustrated in FIG. 1A, first dielectric caps 125 may be formed above the first interconnect lines 121. In an embodiment, top surfaces 134 of the first dielectric caps 125 may be substantially coplanar with a top surface 127 of the first hardmask layer 105. Embodiments of the invention further include second dielectric caps 126 that are formed above the second interconnect lines 122. In an embodiment, top surfaces 134 of the second dielectric cap 126 may be substantially coplanar with a top surface 137 of the etchstop liner 136. Additional embodiments may include top surfaces 134 of the first and second dielectric caps 125, 126 that are substantially coplanar with each other.

Embodiments of the invention include first and second dielectric caps 125, 126 made from dielectric materials such as $SiO_XC_YN_Z$, non-conductive metal oxides and nitrides, such as, but not limited to, TiO, ZrO, TiAlZrO, AlO, or organic materials. According to an embodiment, the first and second dielectric caps are made with the same material. According to an additional embodiment, first dielectric caps 125 and second dielectric caps 126 are made from different materials.

According to an embodiment, the first dielectric caps 125 are made from a material that has a high selectivity over the second dielectric caps 126 during an etching process. As used herein, when a first material is stated as having a high selectivity over a second material, the first material etches at a faster rate than the second material during a given etching process. For example, the first dielectric caps 125 may have an etch selectivity to the second dielectric cap that is approximately 10:1 or greater for a given etching process (i.e., for the given etching process, the first dielectric cap is etched at a rate that is approximately ten times greater than the rate at which the second dielectric cap is etched). According to an additional embodiment, the second dielectric caps 126 are made from a material that has a high selectivity over the first dielectric caps 125. For example, the second dielectric cap 126 may have an etch selectivity to the first dielectric cap 125 that is approximately 10:1 or greater. Additional embodiments of the invention include forming the first and second dielectric caps 125, 126 from materials that have a high selectivity over the first hardmask layer 105 during an etching process.

Embodiments of the invention may also include first and second dielectric caps 126 that are selectively etched with respect to the etchstop liner 136. According to an embodiment, the etchstop liner 136 may be a conformal layer that is deposited over the surface of one or more of the first and second dielectric caps 125, 126, and over the first hardmask layer 105. By way of example, the etchstop liner 136 may have a thickness that is approximately 5.0 nm or less. Additional embodiments include an etchstop liner 136 that has a thickness that is between approximately 2.0 nm and 3.0 nm. The etchstop liner 136 may be a dielectric material. By way of example, the etchstop liner may be an aluminum oxide or a hafnium oxide. By way of example, the etchstop liner may have an etch selectivity to the first and second dielectric caps that is approximately 10:1 or greater. An additional embodiment of the invention may include an etchstop liner that has an etch selectivity to the first and second dielectric caps that is approximately 20:1 or greater. For example, the first and second dielectric caps may be materials that are susceptible to removal with a dry-etching process, whereas the etchstop liner 136 is a material that is resistant to the dry-etching process, but may be selectively removed with a wet-etching process.

Embodiments that utilize an etchstop liner 136 that has a high etch selectivity with respect to the first and second dielectric caps 125, 126 provides additional benefits. For example, in embodiments where the etchstop liner 136 is formed over the top surfaces 132 of either the first dielectric caps 125 or the second dielectric caps 126, the etch selectivity between the first and second dielectric caps 125, 126 does not need to be as high. The etch selectivity between the first and second dielectric caps 125, 126 may be reduced because the etchstop liner 136 protects one set of dielectric caps from an etching process while the other set of dielectric caps are left exposed.

For example, in FIG. 1A the first dielectric caps 125 are covered by the etchstop liner 136 and the second dielectric caps 126 are not covered by the etchstop liner 136. Accordingly, the first and second dielectric caps 125, 126 may have etch selectivities with respect to each other that are less than approximately 10:1. In some embodiments, the first and second dielectric caps 125, 126 may be the same material and, therefore, have no etch selectivity with respect to each other. While the first dielectric caps 125 are illustrated as being covered in FIG. 1A, it is to be appreciated that the embodiments are not limited to such configurations. Alternative embodiments may also include having the second dielectric caps 126 covered by the etchstop liner 136 and the first dielectric caps 125 not covered by the etchstop liner 136.

Figure 1B:
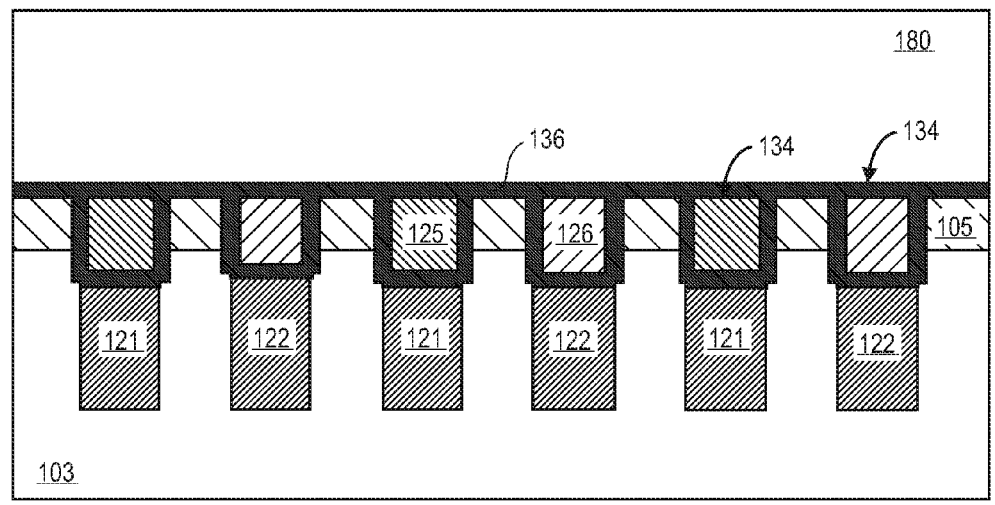
FIG. 1B is a cross-sectional illustration of an interconnect structure that includes an etchstop liner formed over each dielectric cap, according to an embodiment.

While embodiments include covering either the first dielectric caps 125 or the second dielectric caps 126 with the etchstop liner, embodiments are not limited to such configurations. For example, an embodiment of the invention illustrated in FIG. 1B has both the first and second dielectric caps 125, 126 covered by an etchstop liner 136. Aside from covering both dielectric caps 125, 126 with an etchstop liner 136, the interconnect structure 100E in FIG. 1B is substantially similar to the interconnect structure 100 disclosed in FIG. 1A.

Referring back to FIG. 1A, the etchstop liner 136 may also be formed over the top surface 132 of the first and second interconnect lines 121, 122. Embodiments may also include forming the etchstop liner 136 along sidewalls 129 of the dielectric caps 125, 126. Providing an etchstop liner 136 over the top surfaces of the interconnect lines 121, 122 ensures that the interconnect lines are not oxidized during the formation of the first and second dielectric caps 125, 126. For example, when a chemical vapor deposition (CVD) process is used to deposit the dielectric caps, elevated temperatures and the presence of moisture may result in the oxidation of the interconnect lines. Oxidized interconnect lines reduce the efficiency and reliability of the device. The presence of the etchstop liner 136 between the interconnect lines and the dielectric cap prevents moisture from getting to the interconnect lines and prevents oxidation.

Figure 1C:
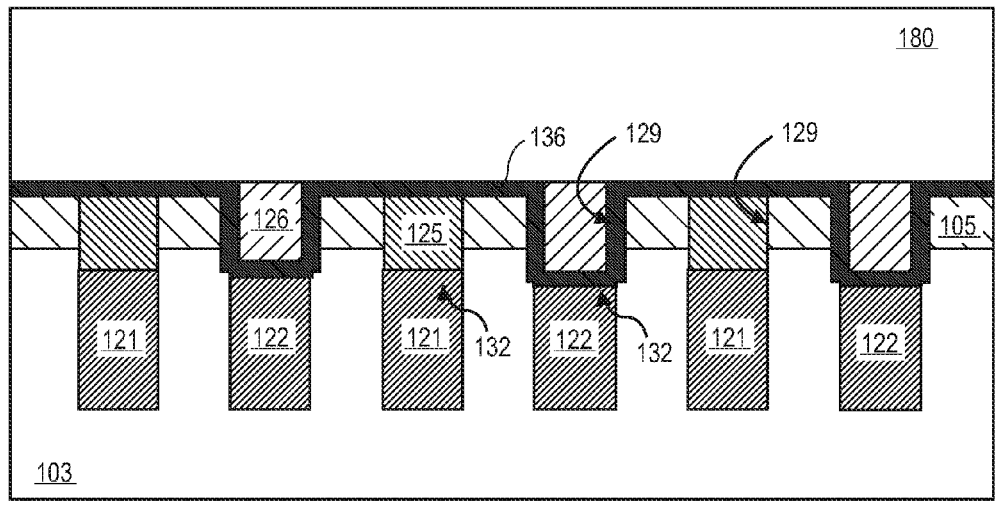
FIG. 1C is a cross-sectional illustration of an interconnect structure that includes an etchstop liner formed between second interconnect lines and second dielectric caps, according to an embodiment.

However, it is to be appreciated that not every deposition process that may be used to form dielectric caps 125, 126 results in the oxidation of the interconnect lines. For example, a silicon-oxide dielectric cap may optionally be formed over interconnect lines with a spin-on process. In such embodiments, the interconnect lines may not be oxidized during the formation of the first and/or second dielectric caps 125, 126. Accordingly, an etchstop liner 136 may be omitted from the top surface 132 of each of the interconnect lines, according to an embodiment of the invention. An interconnect structure 100c according to such an embodiment is illustrated in FIG. 1C. Interconnect structure 100c is substantially similar to the cross-sectional illustration of the interconnect structure 100 in FIG. 1A, except that the first interconnect lines 121 do not have an etchstop liner 136 formed over their top surfaces 132. In such embodiments, the first dielectric cap 125 may be in direct contact with the first interconnect line 121. In an alternative embodiment, the etchstop liner 136 may optionally be omitted over the top surfaces of the second interconnect lines 122. In an embodiment, the etchstop liner 136 may optionally be omitted over the top surfaces 132 of both interconnect lines 121, 122.

Figure 1D:
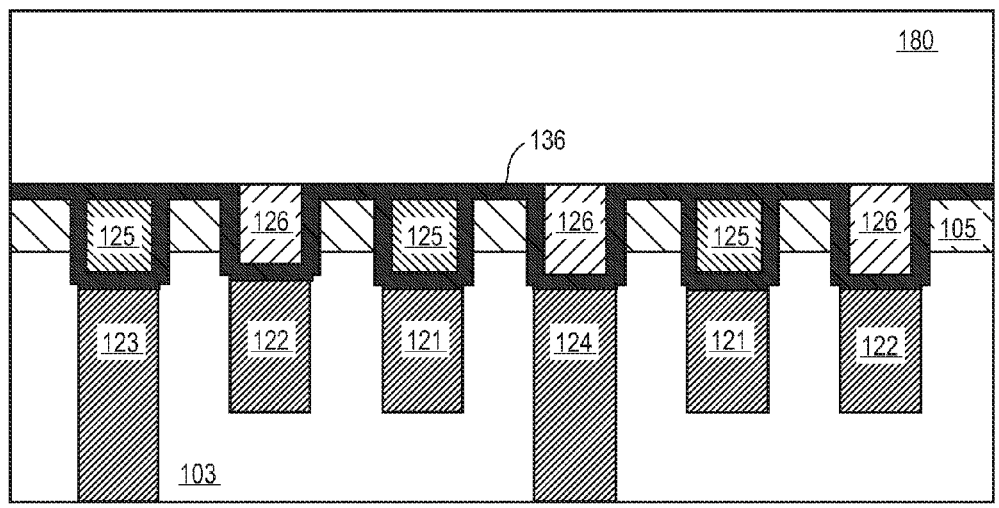
FIG. 1D is a cross-sectional illustration of an interconnect structure that includes an etchstop liner and a plurality of through vias, according to an embodiment.

Referring now to FIG. 1D, a cross-sectional view of an interconnect device $100_D$ according to an additional embodiment is shown. The interconnect device $100_D$ in FIG. 1D is substantially similar to the one shown in FIG. 1A and further includes a first through via 123 and second through via 124. According to embodiments of the invention, the first and second through vias 123, 124 are integrated into the alternating pattern of the first and second interconnect lines 121,122. As such, in embodiments of the invention, a first through via 123 is formed where a first interconnect line 121 would otherwise be formed. Similarly, embodiments include forming a second through via 124 where a second interconnect line 122 would otherwise be formed.

First through vias 123 are substantially similar to the first interconnect lines 121, with the exception that the line is formed all the way through the ILD 103. Accordingly, the first through via 123 provides the ability to make an electrical connection through the ILD 103 to a lower level. For example, the electrical connection to the lower level may be made to a conductive line, an S/D contact of a transistor device, or any other feature of a semiconductor device that requires an electrical connection. Likewise, second through vias 124 are substantially similar to the second interconnect lines 122, with the exception that the line is formed all the way through the ILD 103. Accordingly, the second through via 124 provides the ability to make an electrical connection through the ILD 103 to the lower level. Illustrations presented in the Figures of the present invention omit the structures of the lower level that may be contacted by the first and second through vias in order to not unnecessarily obscure the present invention.

Embodiments of the invention further include first and second dielectric caps 125, 126 formed above the first and second through vias 123, 124 that are substantially similar to those described above with respect to the dielectric caps formed above the first and second interconnect lines 121, 122. Furthermore, the dielectric caps above the first and second through vias may be separated from the interconnect lines by an etchstop liner 136. Additional embodiments may also include forming an etchstop liner 136 over the top surfaces 134 of one or more of the dielectric caps formed over the through vias.

Embodiments of the invention allow for improved contact formation to tightly pitched interconnect lines. As described above, tightly pitched interconnect lines require increasingly precise alignment to form contacts to the desired interconnect lines. However, as shown in the contact formation process illustrated in FIGS. 2A-2H, an interconnect structure that includes dielectric caps 125, 126 and an etchstop liner 136 allows for the contacts to be wider and have a greater margin of alignment error due to the etch selectivities of the dielectric caps, the hardmask layer, and the etchstop liner. FIGS. 2A-2H illustrate an exemplary contact formation process that allows for a plurality of contacts to be made to interconnect lines and through vias. The exemplary contact formation process illustrates that embodiments of the invention allow for a contact to be made to adjacent first and second interconnect lines, a contact that is made to only a second interconnect line, and a contact that is made only to a first interconnect line. While all three configurations are illustrated during the process flow on a single interconnect structure, embodiments are not limited to such configurations. For example, a process may be used that includes the formation of one or more different contact configurations described herein.

Figure 2A:
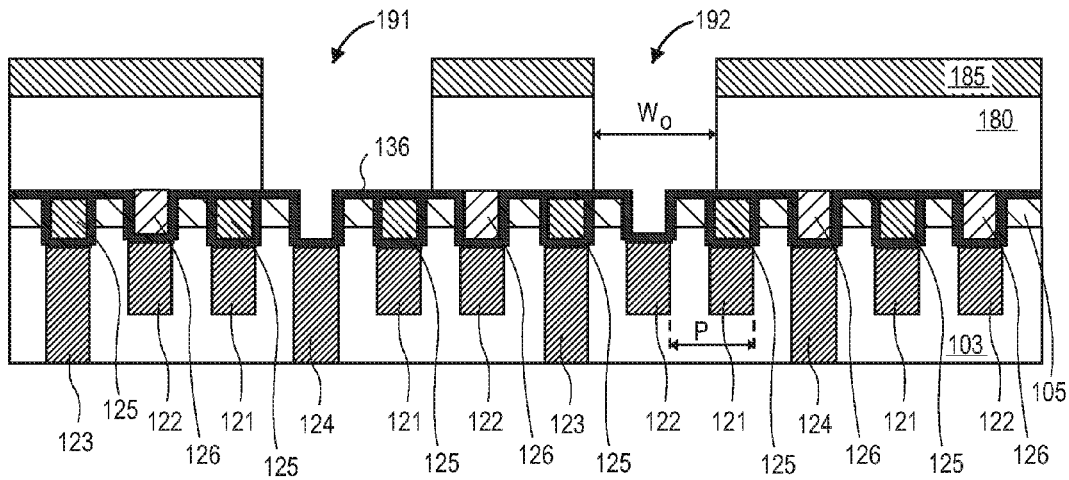
FIGS. 2A-2H are cross-sectional illustrations that illustrate a method of forming contacts to a plurality of interconnect lines, according to an embodiment.

Referring now to FIG. 2A, a sacrificial material 185 is formed over the second ILD 180 and patterned to from a first opening 191 and a second opening 192. In an embodiment, the pattern of the first opening 191 and the second opening 192 may be transferred into the second ILD 180 with an etching process. In an embodiment, the first opening 191 may be used to form a first contact that provides a connection through the second ILD 180 to adjacent first and second interconnect lines or vias. In an embodiment, the second opening 192 may be used to form a second contact that provides a connection through the second ILD 180 to a second interconnect line 122 or via 124. As illustrated, embodiments of the invention allow for the widths of the openings to be larger than the pitch P of the interconnect lines. For example, the width $W_O$ of the second opening 192 is greater than the pitch P of the interconnect lines. Due to the etch selectivity that is provided according to embodiments of the invention, the width $W_O$ may even be large enough to allow the second opening 192 to extend over neighboring interconnect lines that are not being contacted.

Thereafter an etching process that selectively etches the exposed second dielectric cap 126 may be performed. For example, the second dielectric cap 126 may be selectively etched with a dry etching process that does not significantly etch the etchstop liner 136. As illustrated, the etchstop liner 136 remains and protects portions of the first hardmask layer 105 and the first dielectric caps 125 from being removed. After the second dielectric caps 126 are removed, the sacrificial material 185 may be removed. For example, the sacrificial material may be removed with an ashing process.

Figure 2B:
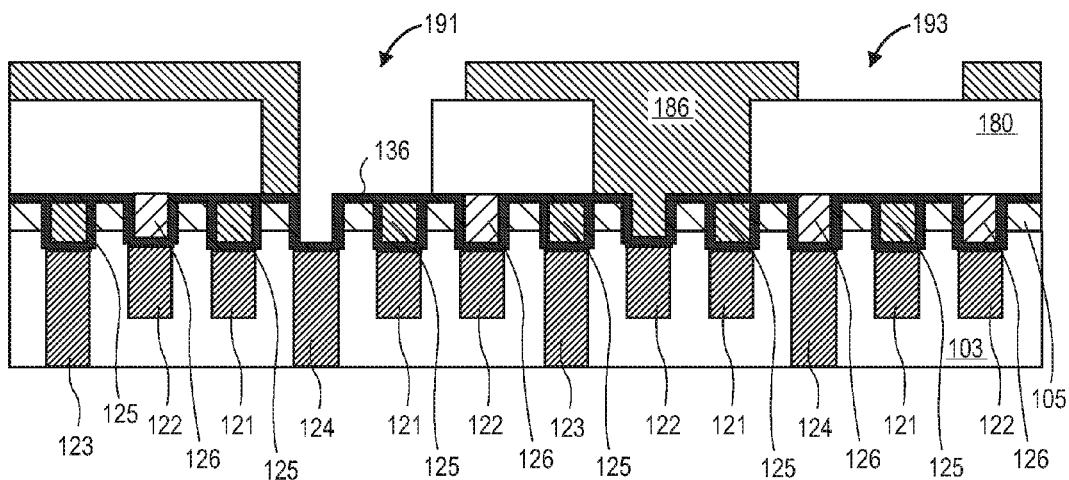

Referring now to FIG. 2B, a second sacrificial layer 186 is formed over the interconnect structure and patterned. According to an embodiment, the second sacrificial layer 186 is patterned to form a third opening 193. In an embodiment, the third opening may be used to form a third contact that provides a connection to a first interconnect line 121 through the second ILD 180. Additionally the second sacrificial layer 186 may be patterned so that the first opening 191 is opened again. As illustrated the patterning used to reopen the first opening 191 does not need to be perfectly aligned with the original first opening 191 that was patterned with the first sacrificial layer 185. The increased overlay error is acceptable because of the etch selectivity between the materials formed over the interconnect lines, according to embodiments of the invention.

Figure 2C:
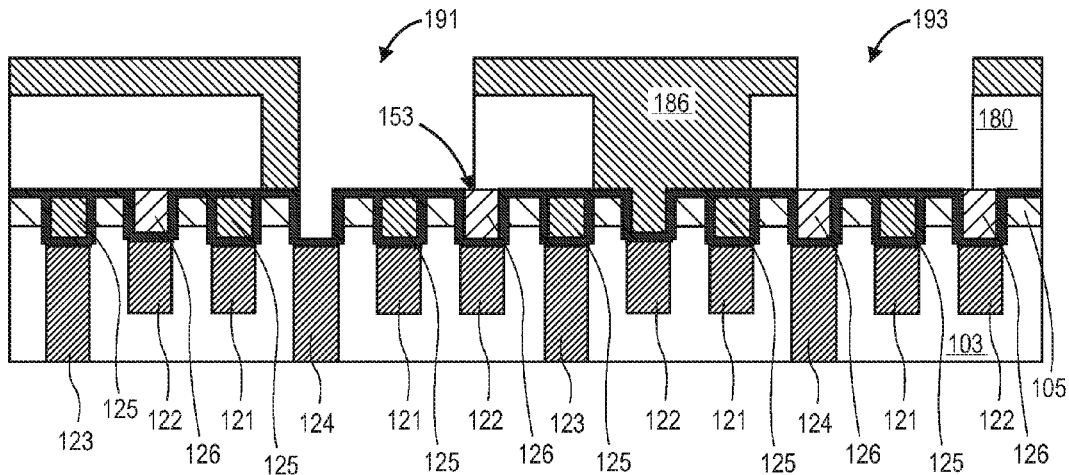

Referring now to FIG. 2C, the patterns for the first opening 191 and the third opening 193 in the second sacrificial layer 186 are transferred into the second ILD 180 with an etching process. According to an embodiment, the etching process is a wet etching process that selectively etches the second ILD 180 with respect to the etchstop liner 136. In an embodiment the etching process may also selectively etch the second ILD 180 with respect to the exposed second dielectric caps 126.

As illustrated in the embodiment depicted in FIG. 2C, the first opening 191 may be wide enough, or misaligned, such that a portion 153 of a neighboring second dielectric cap 126 is exposed. Exposure of the portion 153 of the second dielectric cap 126 is acceptable because the etch selectivities of the exposed materials will prevent the second dielectric caps 126 from being completely removed by subsequent etching processes. Accordingly, when the contact metal is deposited in a subsequent process, a short circuit will not be formed to the interconnect line or via below the partially exposed second dielectric cap 126.

Figure 2D:
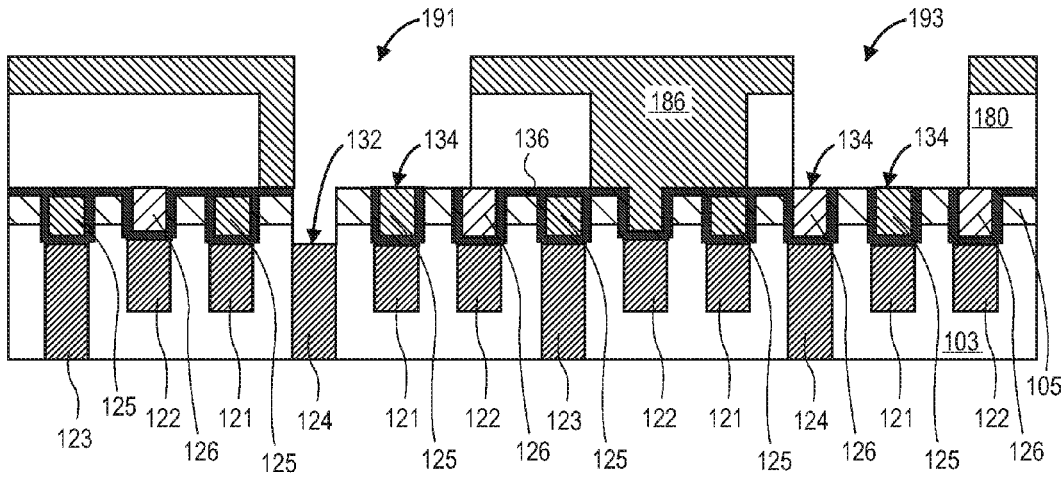

Referring now to FIG. 2D, the exposed portions of the etchstop liner 136 are removed. Since the etchstop liner 136 may be selectively etched with respect to the first and second dielectric caps 125, 126 and the first hardmask layer 105, the etchstop liner 136 may be completely removed without removing a substantial portion of the other materials. By way of example, the etchstop liner 136 may be a material that is selectively removed with a wet etching chemistry, whereas the dielectric caps and the first hardmask are not susceptible to a significant degree of etching in the presence of the wet etching chemistry. As illustrated, the removal of the etchstop liner 136 exposes the top surface 132 of the second through via 124 in the first opening 191. Additionally, the removal of the etchstop liner 122 in the third opening 193 exposes top surfaces 134 of the first and second dielectric caps 125, 126.

Figure 2E:
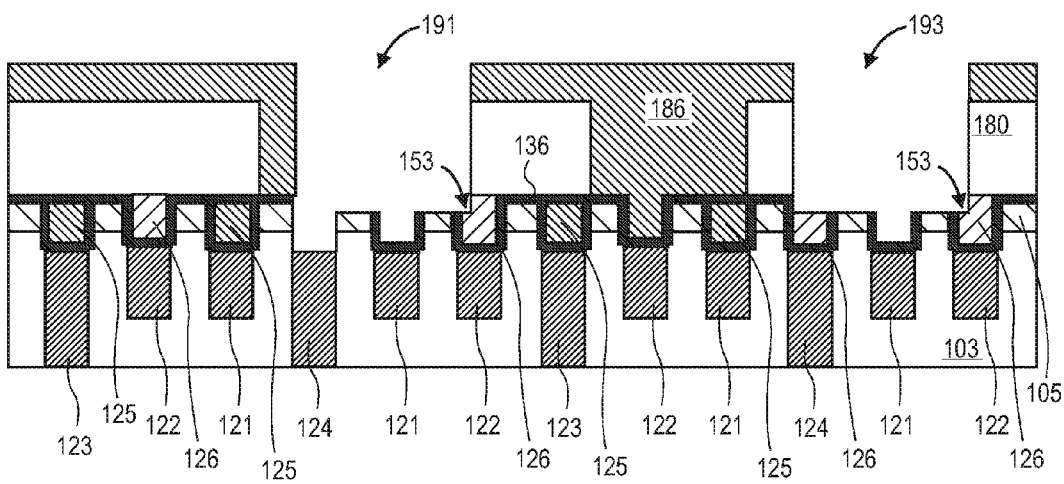

Referring now to FIG. 2E, the first dielectric caps 125 are removed. In an embodiment, the first dielectric caps 125 are removed with an etching process that selectively removes the first dielectric caps 125 relative to the second dielectric caps 126 and the hardmask 105. As illustrated, the selectivity of the etching process may completely remove the first dielectric cap 125 while only removing a small amount of the exposed portions 153 of the second dielectric caps 126 and the exposed portions of the first hardmask 105. The extent of the removal of portions of the second dielectric caps 126 and the first hard mask layer 105 is dependent on the etch selectivity of the first dielectric cap 125 with respect to the other materials for a given etching process. By way of example, the first dielectric cap 125 may have an etch selectivity of approximately 2:1 or greater with respect to either the second dielectric cap 126 or the first hard mask layer 105. While FIG. 2E illustrates the removal of a portion of the exposed first hardmask layer 105 and a portion of the exposed second dielectric caps 126, it is to be appreciated that the amount of the exposed portions 153 of the second dielectric caps 126 and the first hardmask layer 105 may be reduced by increasing the etch selectivity of the first dielectric cap 125 with respect to the materials used to form the first hardmask layer 105 and/or the second dielectric cap 126.

Figure 2F:
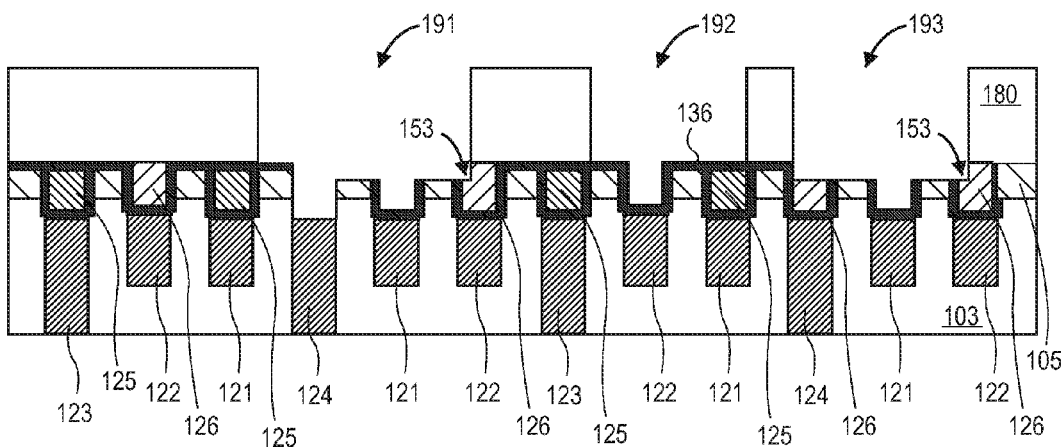

Thereafter, the second sacrificial material layer 186 may be removed, as illustrated in FIG. 2F. In an embodiment, the second sacrificial material layer 186 may be removed with an ashing process. After the removal of the second sacrificial material layer 186, the first opening 191, the second opening 192, and the third opening 193 may be exposed.

Figure 2G:
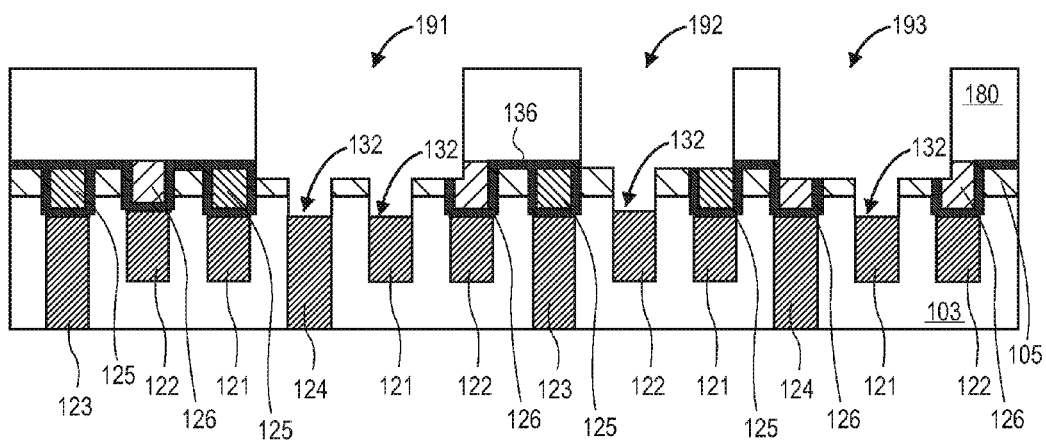

In an embodiment, remaining portions of the etchstop liner 136 formed over contacts are removed, as illustrated in FIG. 2G. By way of example, the etchstop liner 136 may be removed with an etching process that selectively removes the etchstop liner with respect to each of the first dielectric caps 125, the second dielectric caps 126, and the first hardmask layer 105. In an embodiment, the etching process may be a wet etching process. According to an embodiment, top surfaces 132 of neighboring first interconnect line 121 and second through via 124 are exposed in the first opening 191. Additional embodiments may include a top surface 132 of a single second interconnect line 122 being exposed in the second opening 192. Additional embodiments may include a top surface 132 of a single first interconnect line 121 being exposed in the third opening 193.

Figure 2H:
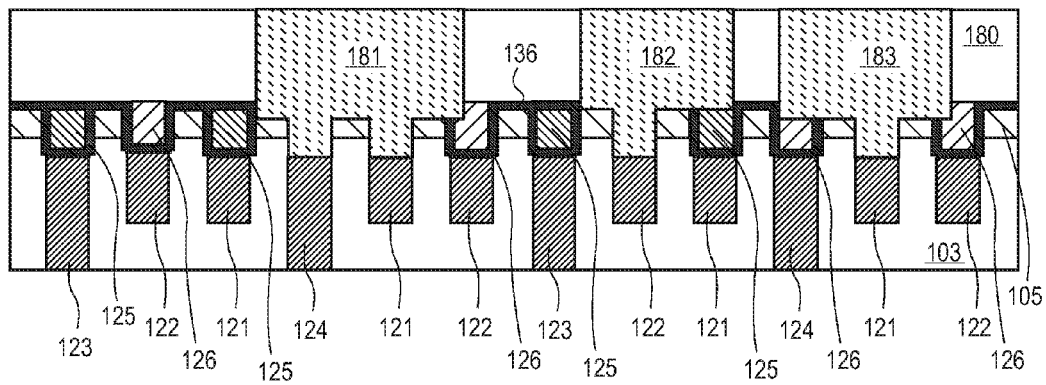

Referring now to FIG. 2H, metal is deposited into the openings formed in the second ILD 180 to form a first contact 181 in the first opening, a second contact 182 in the second opening, and a third contact 183 in the third opening. In an embodiment, any overburden from the metal deposition process may be polished or etched back such that the top surfaces of the second ILD 180 and the contacts are substantially coplanar with each other. By way of example, the metal may be deposited with any metal deposition processes, such as CVD, ALD, or electroplating. By way of example, the metal may be planarized with a top surface of the second ILD 180 with a planarization process, such as CMP.

As illustrated, connections can be selectively made even when the overlay is not perfect. For example, the second contact 182 extends over more than one interconnect line, but the connection is made to a single interconnect line 122. Similarly, the third contact 183 extends over three separate interconnect lines, but the connection is made to a single interconnect line 121. Accordingly, the width of the contacts may be larger than otherwise possible, and misalignment errors do not result in unwanted short-circuiting to a neighboring interconnects. The larger width of the contacts also eases demands on fabrication equipment and may provide a higher yield.

Figure 3A:
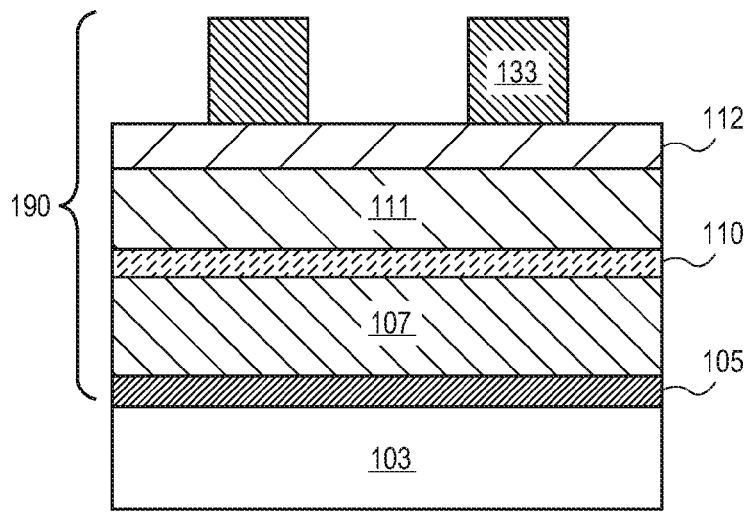
FIGS. 3A-3X are cross-sectional illustrations that illustrate a method of forming an interconnect structure that includes an etchstop liner, according to an embodiment.
Figure 3B:
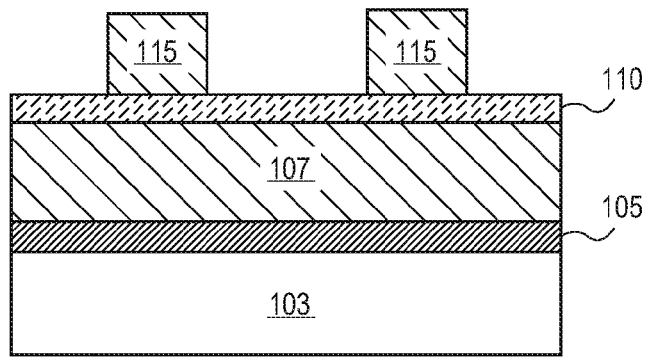
Figure 3C:
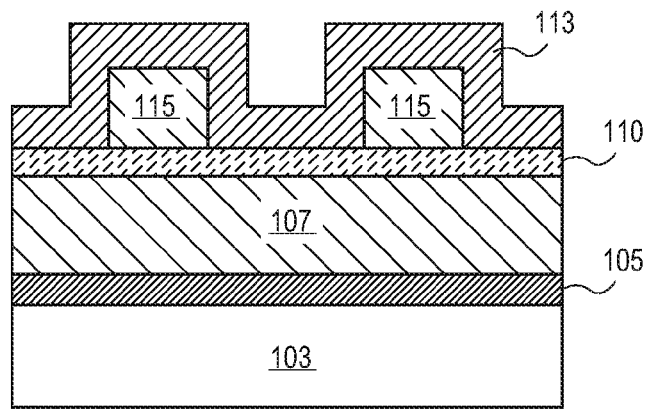
Figure 3D:
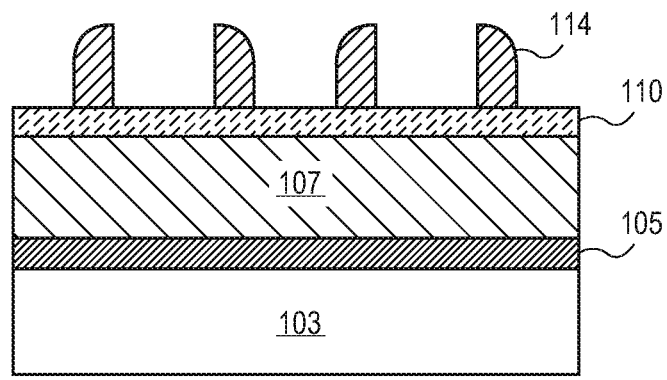
Figure 3E:
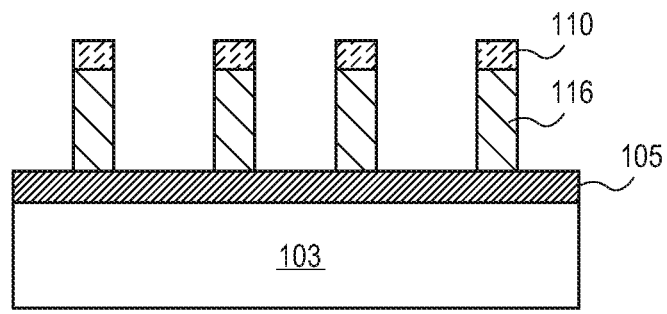
Figure 3F:
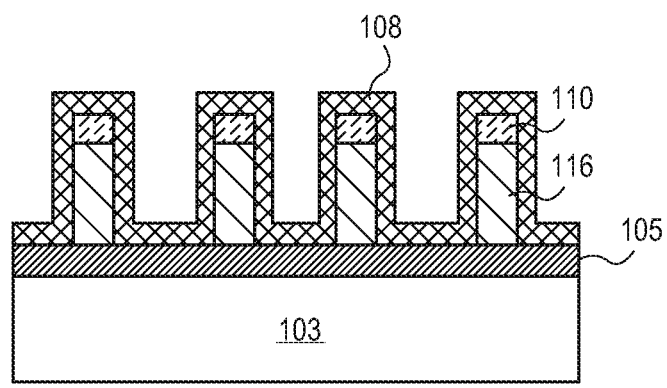
Figure 3G:
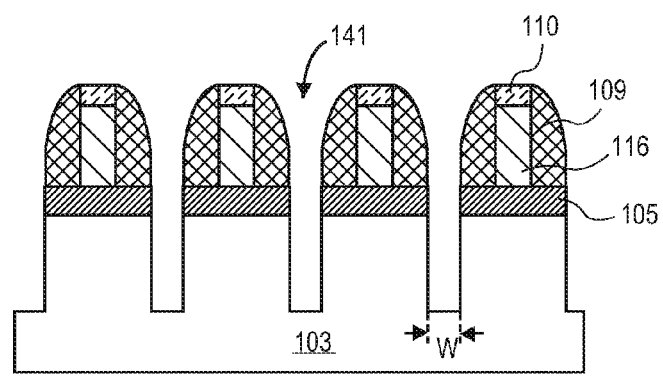
Figure 3H:
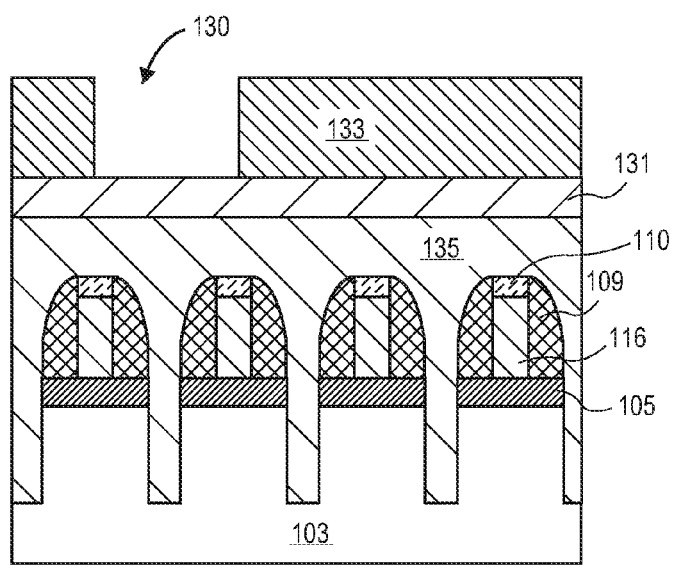
Figure 3I:
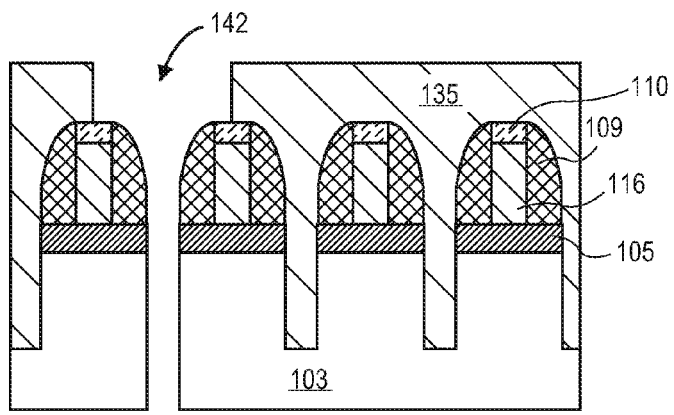
Figure 3J:
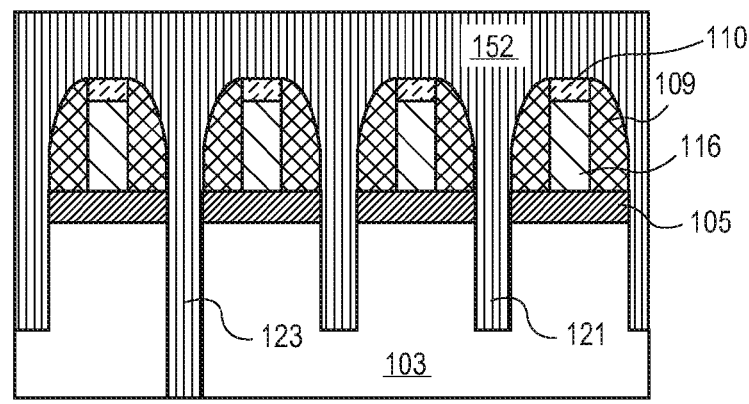
Figure 3K:
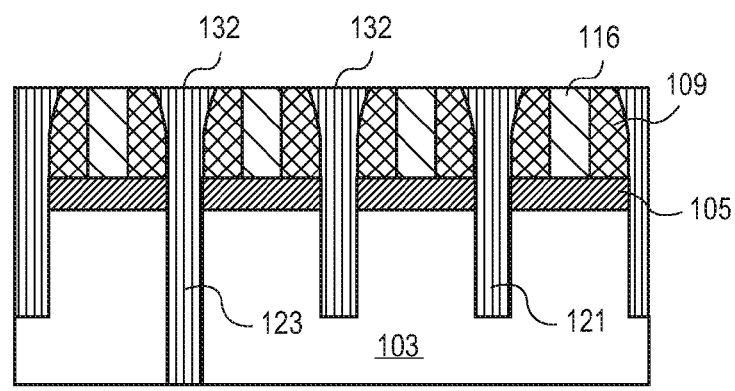
Figure 3L:
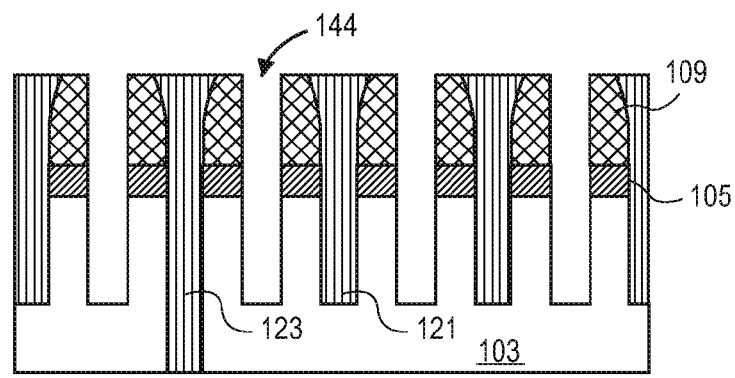
Figure 3M:
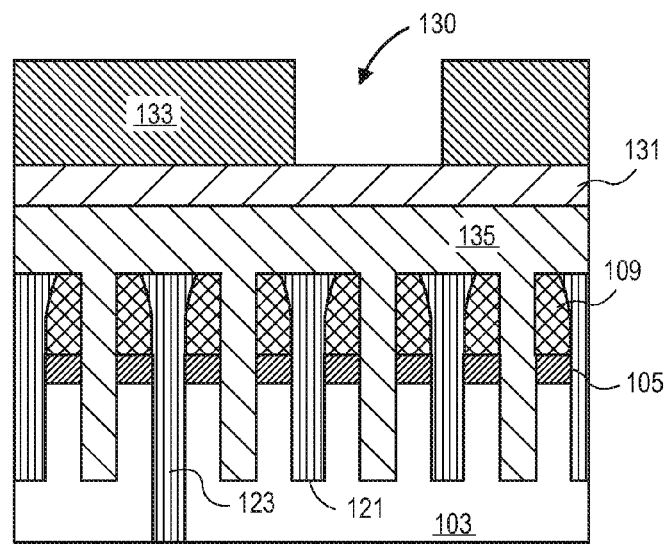
Figure 3N:
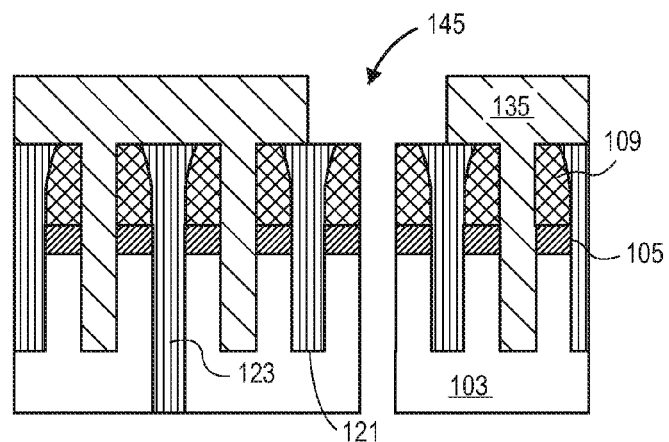
Figure 3O:
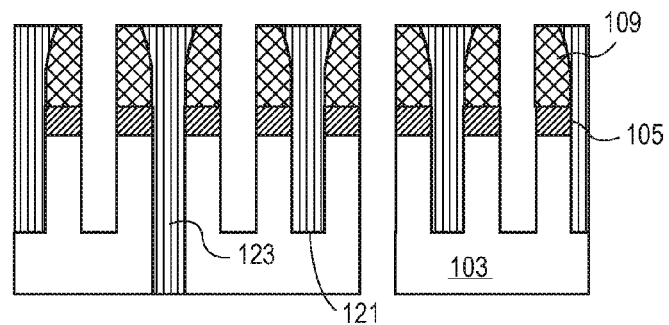
Figure 3P:
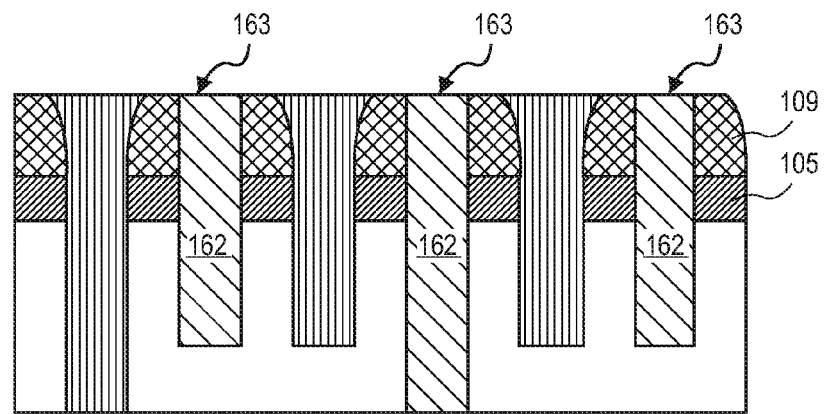
Figure 3Q:
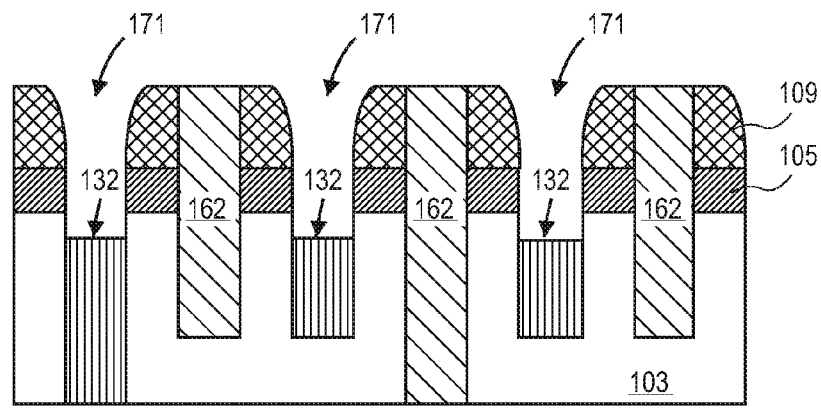
Figure 3R:
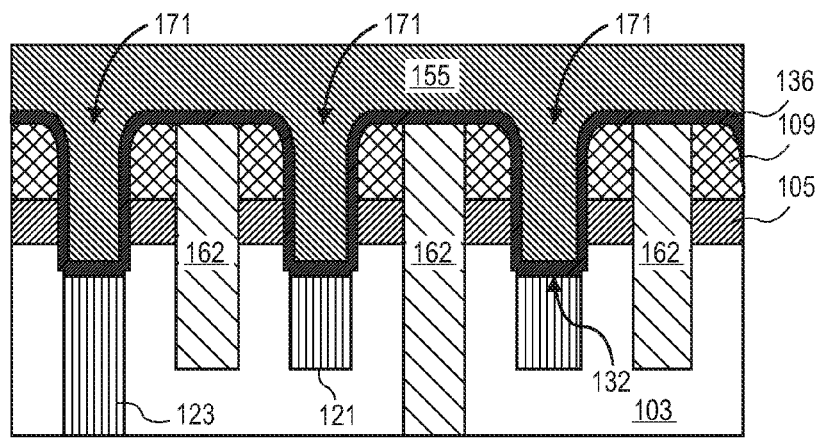
Figure 3S:
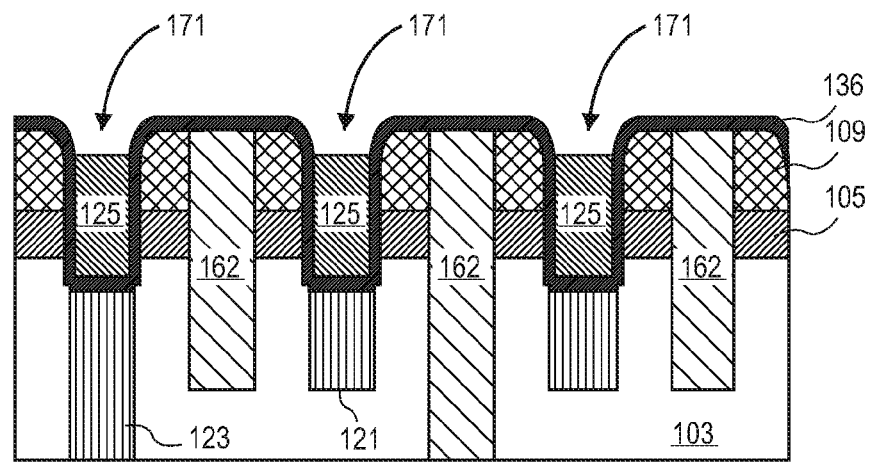
Figure 3T:
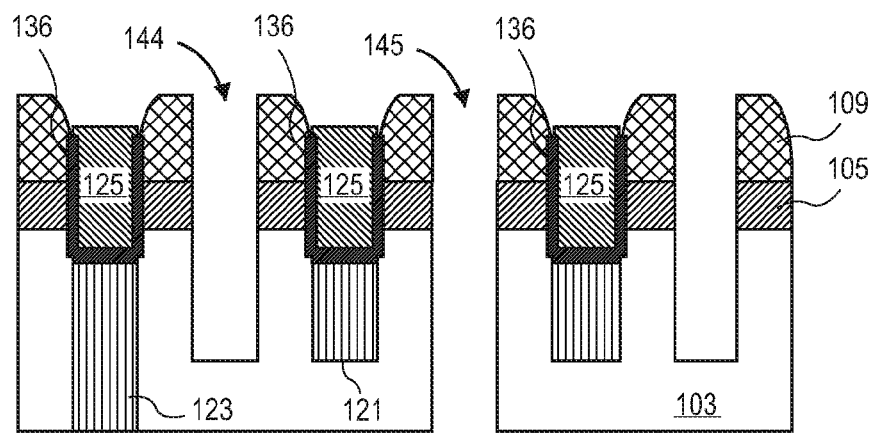
Figure 3U:
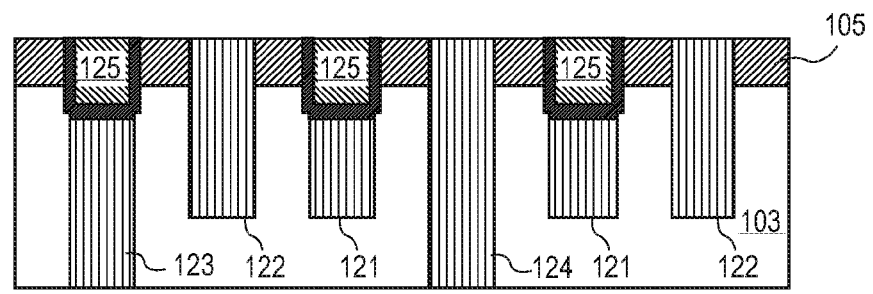
Figure 3V:
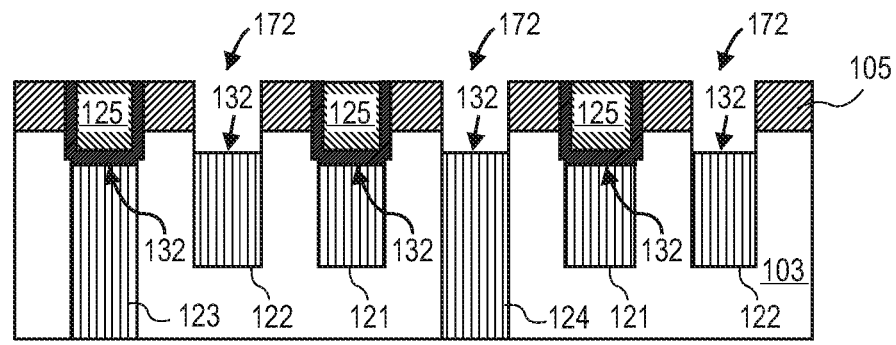
Figure 3W:
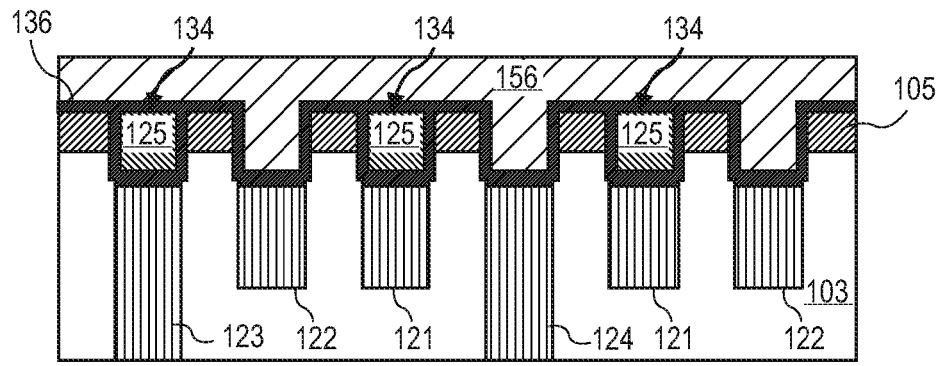
Figure 3X:
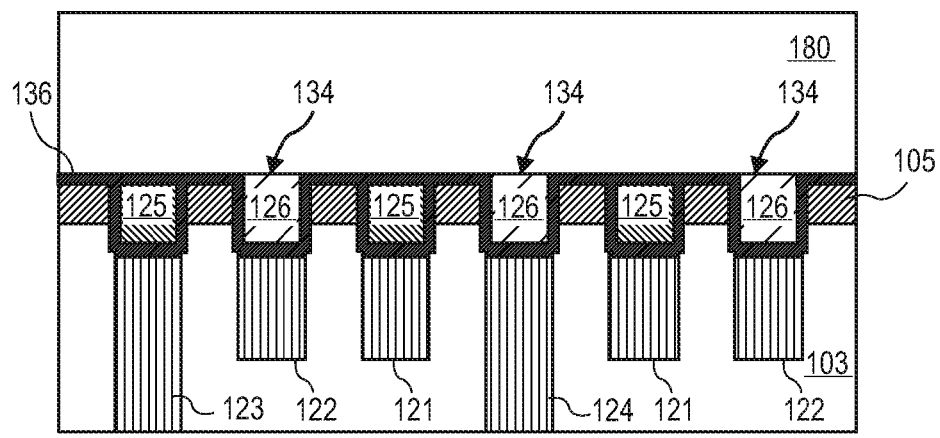

Interconnect structures according to embodiments of the invention may be manufactured according to the process described with respect to FIGS. 3A-3X. Referring now to FIG. 3A, the ILD 103 in which the interconnect structure 100 will be formed is shown. According to embodiments of the invention, a masking stack 190 is formed above the ILD 103. According to embodiments of the invention, the masking stack 190 comprises multiple layers suitable for masking and etching features into the ILD 103. According to an embodiment, the masking stack 190 may comprise a first hardmask layer 105, such as a nitride or an oxide material, formed over the ILD 103. As described above, the first hardmask layer 105 may be chosen based on its etch selectivity to other features that will be formed in subsequent processing operations, such as the first and second dielectric caps and/or the etchstop liner. According to embodiments, ILD 103 may be formed over one or more additional interconnect structures (not shown), or ILD 103 may be formed over a device substrate, such as a semiconducting substrate on which electrical circuitry is formed (not shown).

Masking stack 190 may further comprise a carbon hardmask 107 that is formed above the first hardmask layer 105. The carbon hardmask 107 may be any material suitable for the formation of a hardmask layer, such as an amorphous silicon or a silicon carbide. A hardmask etchstop layer 110 may be formed above the carbon hardmask 107. According to embodiments of the invention, the hardmask etch-stop layer 110 may be an etch resistant material, such as, but not limited to TiO, ZrO, AlN, ZrAlTiO, or AlO. Masking stack 190 may also comprise a dummy hardmask layer 111 that is formed above the hardmask etchstop layer 110. According to an embodiment of the invention, the dummy hardmask layer 111 may be any material suitable for the formation of a hardmask layer, such as an amorphous silicon or a silicon carbide. According to an embodiment, the masking stack 190 may further comprise an antireflective layer 112, such as an amorphous silicon layer, formed above the dummy hardmask layer 111. The antireflective layer 112 may be included in the masking stack 190 in order to provide better control of patterning of a mask layer 133 formed above the antireflective layer 112. The mask layer 133 may be a material typically patterned with a lithographic process, such as a photo-sensitive resist. As shown in FIG. 3A, the mask layer 133 has been patterned to form the desired shape for a first structure that will be transferred into the dummy hardmask layer 111.

Referring now to FIG. 3B, the pattern of the mask layer 133 has been transferred into the dummy hardmask layer 111 to form the first backbones 115. Embodiments of the invention transfer the pattern of the mask layer 133 into the dummy hardmask layer 111 with an etching process, such as a wet or dry etching process known in the art. The remaining portions of the antireflective coating 112 and the mask layer 133 may then be removed.

Next in FIG. 3C, a spacer forming layer 113 is formed over the first backbones 115 and the exposed portions of the hardmask etch-stop layer 110. The spacer forming layer 113 may be a material typically used for the formation of dielectric spacers, such as an oxide or a nitride. A spacer etching process is then used to form the spacers 114 on each side of the first backbones 115. Embodiments include a spacer etching process that selectively removes the material from the spacer forming layer 113 that is formed on horizontal surfaces, thereby leaving spacers 114 along the sidewalls of the first backbones 115. Subsequent to the spacer formation, the first backbones 115 are etched away to leave the spacers 114, as shown in FIG. 3D.

Referring now to FIG. 3E, the spacers 114 are used as an etch-mask, and their pattern is transferred into the hard mask layer 107. After the etching process, portions of the hard mask layer 107 and the etch-stop layer 110 remain. As used herein, the remaining portions of the hard mask layer 107 may also be referred to as the second backbone 116. Embodiments utilize etching processes known in the art, such as wet or dry etching process, to transfer the pattern of the spacers 114 into the hard mask layer 107 to form the second backbone 116.

Referring now to FIG. 3F, the second backbone 116 is then covered with a film 108. The film 108 is material that may be used to form a second spacer material. According to an embodiment, the film 108 may be a hard and conformal material, such as, but not limited to TiO, ZrO, AlN, AlO, and combinations thereof. According to an embodiment of the invention, the materials used for the second backbone 116 have a high etch selectivity over the material used for the second film 108 during an etching process. According to such embodiments, the material forming the film 108 is resistant to an etching process that will readily etch away the backbone 116. By way of example, when the second backbones 116 are made from an amorphous silicon, then film 108 may be made with titanium oxide.

Referring now to FIG. 3G, a spacer etching process has been performed in order to turn film 108 into spacers 109. Embodiments include an anisotropic spacer etching process that selectively removes the portions of the film 108 that are formed on horizontal surfaces, thereby leaving spacers 109 along the sidewalls of the second backbones 116. Thereafter, a first trench etching process is used to form first trenches 141 through the first hardmask layer 105 and into the ILD 103. The first trench etching process utilizes the spacers 109 as a mask in order to provide the proper spacing between the first trenches 141 and to form the first trenches 141 with the desired width W. According to an embodiment of the invention, the width W is less than approximately 30 nm. An additional embodiment of the invention includes a width W that is less than 15 nm. In an embodiment the first trenches 141 may have a depth between approximately 20 nm and approximately 60 nm. Additional embodiments of the invention include forming the first trenches 141 to a depth of approximately 40 nm.

Referring now to FIG. 3H, a through via masking process may be implemented according to an embodiment of the invention. A carbon hard mask 135 is formed into the trenches 141 and above the spacers 109. An antireflective coating 131, such as amorphous silicon, may be formed over the carbon hardmask 135. A via mask 133, such as a photoresist, is formed and patterned to have a mask opening 130 formed above one of the first trenches 141, as shown in FIG. 3H.

Referring now to FIG. 3I, the carbon hardmask 135 below the mask opening 130 is then etched away. The etching process also etches through the remaining portions of the ILD 103 below the bottom of the first trench to form a through via opening 142. Through via opening 142 may provide a connection to layers or features below ILD 103. While a single through via opening 142 is shown, embodiments may also include interconnect structures 100 with more than one through via opening 142.

Referring now to FIG. 3J, the remaining portions of the carbon hardmask layer 135 are removed and a conductive layer 152 may be formed in and above the first trenches 141 to form the first interconnect lines 121 and into the through via opening 142 to form the first through via 123, according to an embodiment. Embodiments of the invention include a conductive layer 152 that may be any conductive metal used for interconnect lines, such as copper, cobalt, tungsten, or the like. Embodiments include disposing the first metal into the first trenches 141 and the through via openings 142 with a deposition process known in the art, such as, but not limited to, chemical vapor deposition (CVD), atomic layer deposition (ALD), or electroplating.

As shown in FIG. 3K, the top surfaces 132 of the first interconnect lines 121 and the first through via 123 have been planarized with the top surfaces of the spacers 109 in order to remove overflow material from the metal deposition. According to an embodiment, the planarization may be performed with a process such as chemical-mechanical planarization (CMP) or an etching process. Additional embodiments of the invention include utilizing the planarization process to remove portions of the hard-mask etchstop layer 110 and expose portions of the second backbone 116.

Referring now to FIG. 3L, the second backbone 116 is etched away. According to an embodiment, the remaining portions of the spacers 109 provide a masking layer for use in etching second trenches 144 that are formed into portions of the ILD 103 that were previously located underneath the second backbone 116. According to an embodiment, the depth of the second trenches 144 may be substantially similar to the depth of the first trenches. According to alternative embodiments, the depth of the second trenches 144 may be greater than or less than the depth of the first trenches.

Referring now to FIG. 3M, a second through via patterning process may be implemented, according to an embodiment of the invention. A carbon hard mask 135 is formed into the second trenches 144 and above the spacers 109. An antireflective coating 131, such as amorphous silicon, may be formed over the carbon hardmask 135. A via mask 133, such as a photosensitive resist or other masking materials, is formed and patterned to have a mask opening 130 formed above one or more of the second trenches 144. Referring now to FIG. 3N, the carbon hardmask 135 underneath the mask opening 130 and the portion of the ILD 103 underneath the second trench 144 are etched away to form through via opening 145. Through via opening 145 may provide a connection to layers or features below ILD 103 (not shown). After the through via opening 145 is formed, the remaining carbon hard mask 135, antireflective coating 131 and masking material 133 are removed, as illustrated in FIG. 3O.

Referring now to FIG. 3P, a sacrificial hardmask material 162 is deposited into the second trenches 144 and into the through via opening 145, according to an embodiment. In an embodiment, the sacrificial hardmask material 162 may be deposited such that the hardmask material covers all of the exposed surfaces, and thereafter, the overburden may be polished back to have top surfaces 163 that are approximately coplanar with top surfaces of the spacers 109.

Thereafter, in FIG. 3Q the first interconnect lines 121 and the first though via 123 may be recessed below the first hard mask layer 105 to form first recesses 171, according to an embodiment of the invention. According to an embodiment, the recess may result in the top surfaces 132 being positioned below the top surface of the first hard mask layer 105. According to an additional embodiment, the top surfaces 132 are substantially coplanar with the top surface of the ILD 103, or recessed below the top surface of the ILD 103. Embodiments include recessing the first interconnect lines 121 with a wet or dry etching process.

Referring now to FIG. 3R, an etchstop liner 136 is formed over the exposed surfaces. In an embodiment, the etchstop liner 136 is formed over the top surfaces 132 of the first interconnect lines 121 and the first through via 123 and along the sidewalls of the first recesses 171. According to an embodiment, the etchstop liner may have a thickness that is less than approximately 5 nm. Additional embodiments include an etchstop liner 136 that has a thickness that is between approximately 2 nm and approximately 3 nm. By way of example, the etchstop liner may be formed with an atomic layer deposition (ALD) process.

Forming the etchstop liner 136 over the top surfaces 132 of the interconnect lines and the through vias protects the conductive material from damage, such as oxidation that may occur in subsequent processing operations if the top surfaces 132 are not protected. However, if subsequent processing will not damage the interconnect lines, then the etchstop liner 136 may optionally be omitted. Such an embodiment, would then follow substantially the same processing operations described with respect to the remaining FIGS. 3S-3X, and would result in an interconnect structure substantially similar to interconnect structure 100c described above with respect to FIG. 1C.

In an embodiment, the material used to form the etchstop liner 136 is a material that is selectively etched with respect to other materials that are used for the first and second dielectric caps that will be formed in subsequent processing operations. For example, the first and second dielectric caps may be materials that can be dry-etched, whereas the etchstop liner 136 is a material that is resistant to dry-etching, but may be selectively removed with a wet-etch. By way of example, the etchstop liner 136 may be aluminum oxide, hafnium oxide, or the like.

Referring again to FIG. 3R, a dielectric layer 155 may be deposited into the first recesses 171 and over the etchstop liner 136. For example, the dielectric layer 155 may be deposited with a CVD, PVD, or spin on process. Thereafter, the dielectric layer 155 may be recessed so that first dielectric caps 125 remain in the first recesses 171 above the first interconnect lines 121 and the first through vias 123, as illustrated in FIG. 3S. According to the illustrated embodiment, the dielectric layer 155 is recessed with an etching process. In embodiments, the etching process is selective to the dielectric layer 155 and leaves the etchstop liner 136 substantially unaltered. According to an additional embodiment, the dielectric layer 155 may be recessed with a polishing process, such as CMP. In such embodiments, portions of the etchstop liner 136, the spacers 109, and the sacrificial hardmask layer 162 may also be removed. Embodiments of the invention may utilize a material such as SiOxCyNz, non-conductive metal oxides, or metal nitrides for the first dielectric caps 125. Additional embodiments of the invention may select a material for the first dielectric caps 125 that has a high etch selectivity over the etch-stop layer 105 and over the second dielectric caps 126 that will be formed in a subsequent processing operation.

Referring now to FIG. 3T, the portion of the etchstop liner 136 formed over the spacers 109 may be removed if it has not been removed previously. By way of example, the etchstop liner may be removed with a polishing process, such as CMP. In an embodiment, the etchstop liner 136 may be removed with an etching process that selectively removes the etchstop liner 136 without removing a substantial amount of the spacer 109, or the first dielectric cap 125. Once the etchstop liner 136 is removed, the sacrificial hardmask 162 is exposed. Embodiments may then include removing the exposed sacrificial hard mask 162 in order to reopen openings 144 and the second through via opening 145. For example, the sacrificial hard mask 162 may be removed with an etching or ashing process.

Referring now to FIG. 3U, a metal layer is deposited into the exposed openings 144 and 145 and any overburden may be polished back to form the second interconnects 122 and the second vias 124. In an embodiment, the metal layer may be the same metal used to form the first interconnects 122 and the first vias 123. In an additional embodiment, the metal may not be the same metal used for the first interconnects 122 and the first vias 123. By way of example, the metal may be any metal typically used for interconnect lines, such as copper, cobalt, tungsten, or the like the As illustrated in FIG. 3U, the polishing process to remove the overburden may also remove the remaining portions of the spacers 109.

Referring now to FIG. 3V, the top surfaces 132 of the second interconnects 122 and the second through vias 124 may be recessed below a bottom surface 128 of the hardmask layer 105 to form second recesses 172. In an embodiment, the top surfaces 132 of the second interconnects 122 and the second vias 124 may be substantially coplanar with the top surfaces 132 of the first interconnects 121 and the first vias 123. In additional embodiments, the top surfaces 132 of the second interconnects 122 and the second vias 124 may be recessed such that they are above or below the top surfaces 132 of the first interconnects 121 and the first vias 123.

Referring now to FIG. 3W, an etchstop liner 136 is deposited over exposed surfaces, according to an embodiment. As illustrated, the etchstop liner 136 may be formed over the top surfaces 134 of the first dielectric caps 125, and the etchstop liner 136 may also line the second recesses 172 above the second interconnect lines 122 and the second through vias 124. The etchstop liner 136 may be substantially similar to the etchstop liner 136 that was deposited in the processing operation disclosed in the description of FIG. 2R. While the etchstop liner 136 may be deposited during one or more different processing operations, the entire etchstop liner 136 will be referred to herein as a single feature. However, it is to be appreciated that embodiments of the invention may also utilize an etchstop liner 136 that comprises different materials, compositions, and/or thicknesses that result from being deposited during different deposition processes.

FIG. 3W also illustrates the deposition of the second dielectric layer 156 into the second recesses 172 above the second interconnect lines 122 and the second through vias 124. In an embodiment, the second dielectric layer 156 may be deposited with a CVD, PVD, or spin-on process. Embodiments of the invention may utilize a material such as SiOxCyNz, non-conductive metal oxides, or metal nitrides for the second dielectric caps 126. Additional embodiments of the invention may select a material for the second dielectric caps 126 that has a high etch selectivity over the first hardmask layer 105, the first dielectric caps 125, and/or the etchstop liner 136.

Thereafter, in FIG. 3X, the overburden of the second dielectric layer 156 may be polished or etched back to form second dielectric caps 126. In an embodiment the top surfaces 134 of the second dielectric caps 126 are substantially coplanar with a top surface of the etchstop liner 136. As illustrated, the etchstop liner 136 may be completely surround the first dielectric caps 125 (i.e., around the top surface, the bottom surface, and the sidewalls of the first dielectric caps 125), and partially surround the second dielectric caps 126 (i.e., over the bottom surface and the sidewalls of the second dielectric caps 126). It is to be appreciated that embodiments of the invention also include an etchstop liner 136 that surrounds more surfaces or fewer surfaces than illustrated in FIG. 3X, such as, for example, the interconnect structures illustrated in FIGS. 1B and 1C. After the etchstop liner 136 has been formed, embodiments of the invention may include depositing a second dielectric layer 180 over the interconnect structure.

Figure 4A:
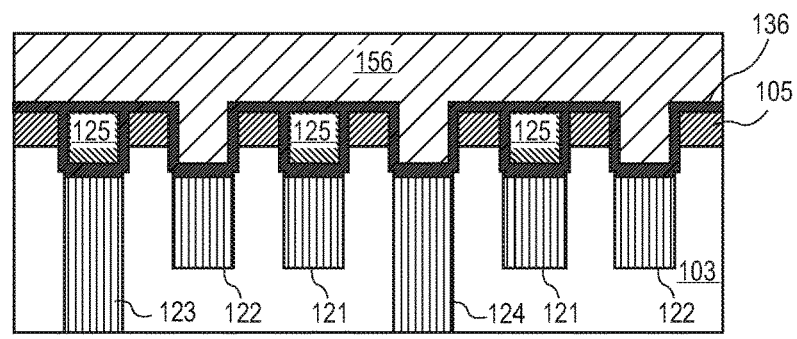
FIGS. 4A-4D are cross-sectional illustrations that illustrate a method of forming an interconnect structure that includes an etchstop liner over each dielectric cap, according to an embodiment.

Referring now to FIGS. 4A-4D, an method for forming an interconnect structure that includes an etchstop liner over the first and second dielectric caps 125, 126 is shown, according to an embodiment. The processing to form the structure illustrated in FIG. 4A is substantially similar to the processing operations illustrated and described with respect to FIGS. 3A-3W, and as such, will not be repeated here.

Figure 4B:
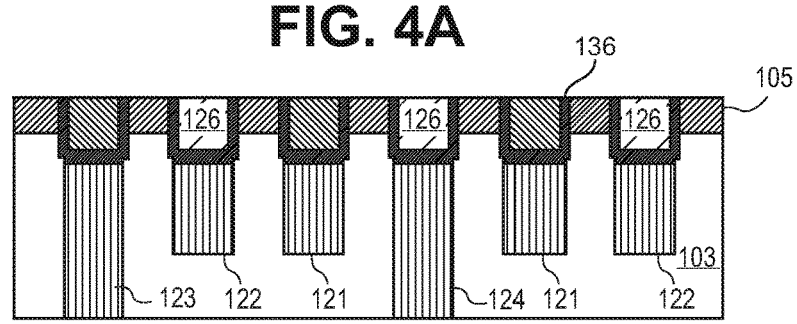

Referring now to FIG. 4B, the overburden of the dielectric layer 156 may be polished back to form second dielectric caps 126. For example, the dielectric layer may be polished back with a CMP process. As illustrated, the polishing process may also remove the portion of the etchstop liner 136 formed above the first dielectric caps 125 and the first hardmask layer 105.

Figure 4C:
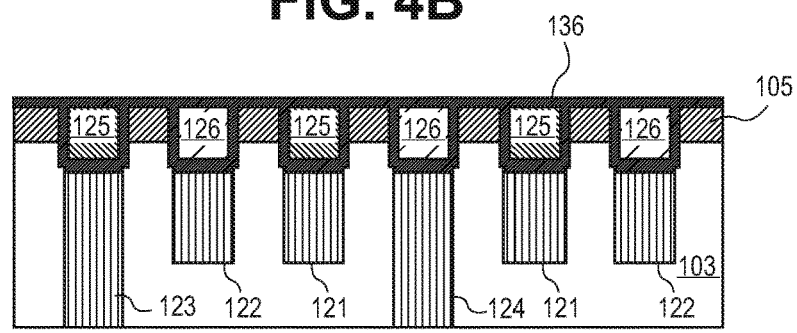
Figure 4D:
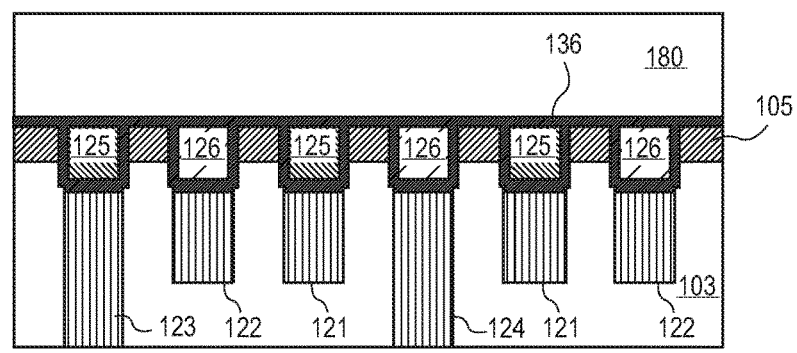

Thereafter, in FIG. 4C, an etchstop liner 136 is deposited over the top surfaces of the first hardmask layer 105, the first dielectric caps 125, and the second dielectric caps 126. A dielectric material may then be deposited over the etchstop liner 136 to form a second dielectric layer 180, as illustrated in FIG. 4D.

Figure 5:
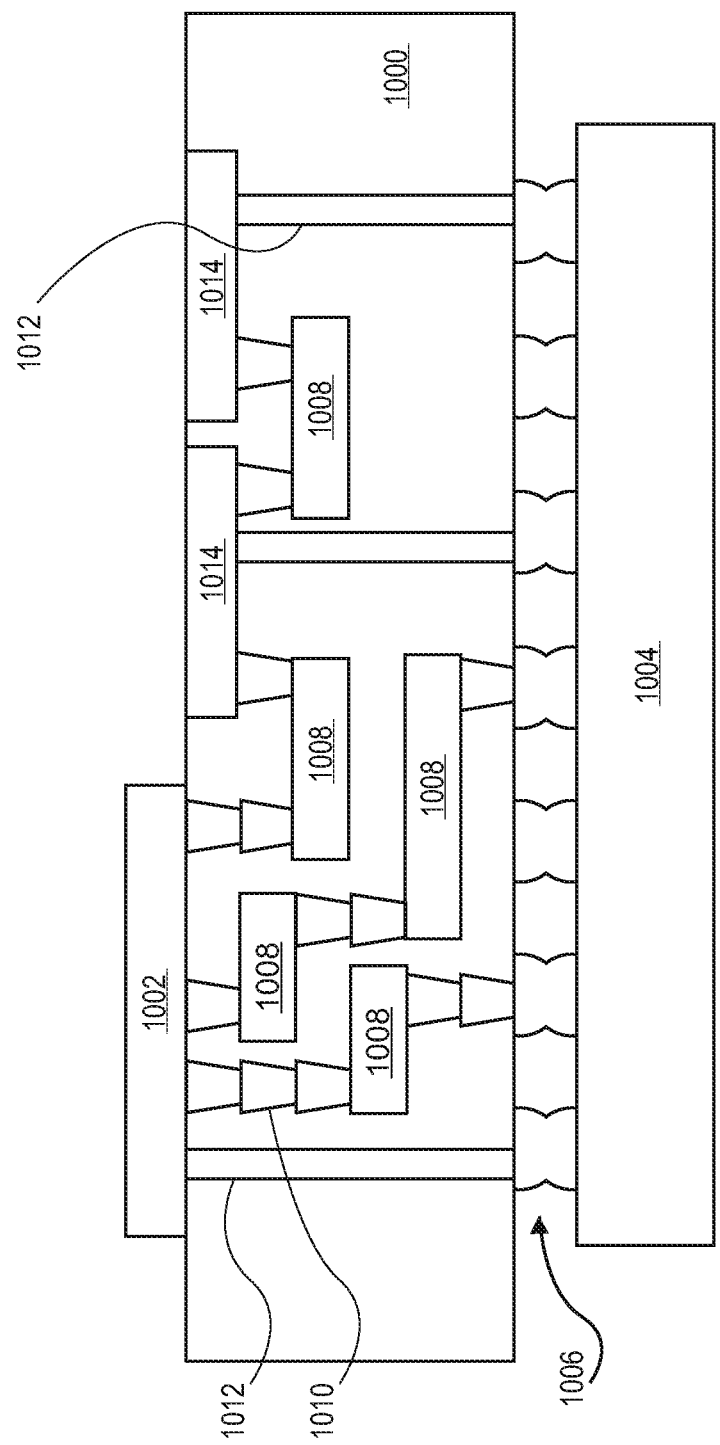
FIG. 5 is a cross-sectional illustration of an interposer implementing one or more embodiments of the invention.

FIG. 5 illustrates an interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the invention, apparatuses or processes disclosed herein for forming an interconnect structure that includes alternating dielectric caps and an etchstop liner may be used in the fabrication of interposer 1000, or in the fabrication of the embedded devices 1014.

Figure 6:
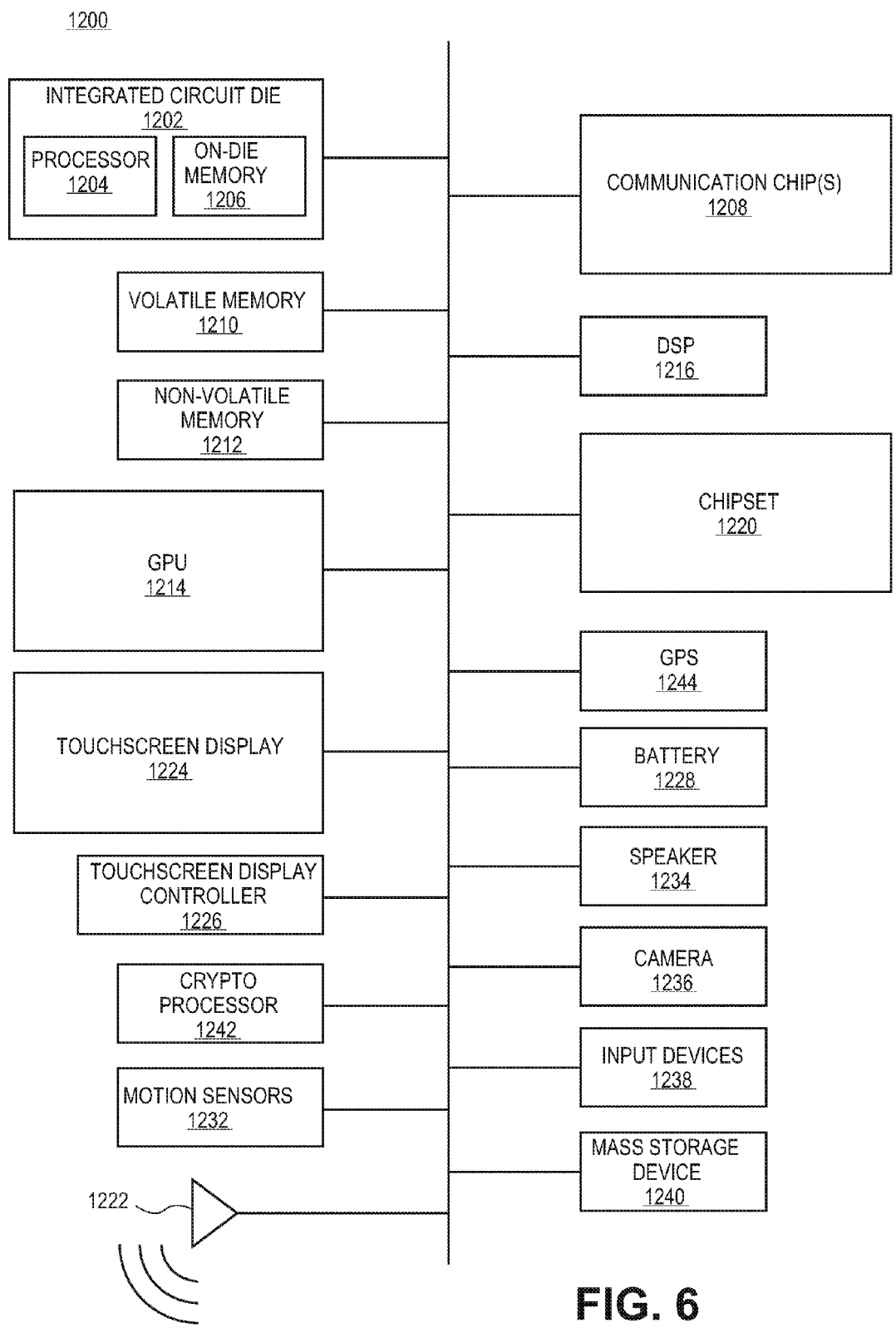
FIG. 6 is a schematic of a computing device built in accordance with an embodiment of the invention

FIG. 6 illustrates a computing device 1200 in accordance with one embodiment of the invention. The computing device 1200 may include a number of components. In one embodiment, these components are attached to one or more motherboards. In an alternate embodiment, these components are fabricated onto a single system-on-a-chip (SoC) die rather than a motherboard. The components in the computing device 1200 include, but are not limited to, an integrated circuit die 1202 and at least one communication chip 1208. In some implementations the communication chip 1208 is fabricated as part of the integrated circuit die 1202. The integrated circuit die 1202 may include a CPU 1204 as well as on-die memory 1206, often used as cache memory, that can be provided by technologies such as embedded DRAM (eDRAM) or spin-transfer torque memory (STTM or STTM-RAM).

Computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory), a graphics processing unit 1214 (GPU), a digital signal processor 1216, a crypto processor 1242 (a specialized processor that executes cryptographic algorithms within hardware), a chipset 1220, an antenna 1222, a display or a touchscreen display 1224, a touchscreen controller 1226, a battery 1228 or other power source, a power amplifier (not shown), a global positioning system (GPS) device 1228, a compass 1230, a motion coprocessor or sensors 1232 (that may include an accelerometer, a gyroscope, and a compass), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth).

The communications chip 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1208. For instance, a first communication chip 1208 may be dedicated to shorter range wireless communications such as Wi-Fi and Bluetooth and a second communication chip 1208 may be dedicated to longer range wireless communications such as GPS, EDGE, GPRS, CDMA, WiMAX, LTE, Ev-DO, and others.

The processor 1204 of the computing device 1200 includes one or more devices, such as transistors that are coupled to one or more interconnect lines that are formed in an interconnect structure that includes alternating dielectric caps and an etchstop liner in accordance with embodiments of the invention. The term "processor" may refer to any device or portion of a device that processes electronic data from registers and/or memory to transform that electronic data into other electronic data that may be stored in registers and/or memory.

The communication chip 1208 may also include one or more devices, such as transistors that are coupled to one or more interconnect lines that are formed in an interconnect structure that includes alternating dielectric caps and an etchstop liner in accordance with embodiments of the invention.

In further embodiments, another component housed within the computing device 1200 may contain one or more devices, such as transistors that are coupled to one or more interconnect lines that are formed in an interconnect structure that includes alternating dielectric caps and an etchstop liner in accordance with embodiments of the invention.

In various embodiments, the computing device 1200 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention may include an interconnect structure comprising: an interlayer dielectric (ILD) with a first hardmask layer over a top surface of the ILD; one or more first interconnect lines in the ILD, wherein a first dielectric cap is above a top surface of each of the first interconnect lines; one or more second interconnect lines in the ILD arranged in an alternating pattern with the first interconnect lines, wherein a second dielectric cap is above a top surface of each of the second interconnect lines; and an etchstop liner over top surfaces of the first dielectric caps. An additional embodiment may also include an interconnect structure, wherein the etchstop liner separates the first dielectric caps from the first interconnect lines. An additional embodiment may also include an interconnect structure, wherein the etchstop liner separates the second dielectric caps from the second interconnect lines, and wherein the etchstop liner is also formed along sidewalls of the second dielectric caps and over the top surface of the first hardmask layer. An additional embodiment may also include an interconnect structure, wherein the etchstop liner is formed over a top surface of the second dielectric caps. An additional embodiment may also include an interconnect structure, wherein the etchstop liner is a material that has an etch selectivity of 10:1 or greater with respect to the first dielectric caps, the second dielectric caps, and the first hardmask layer during an etchstop liner etching process. An additional embodiment may also include an interconnect structure, wherein the etchstop liner etching process is a wet etching process. An additional embodiment may also include an interconnect structure, wherein a dry etching process selectively etches at least one of the first dielectric caps or the second dielectric caps. An additional embodiment may also include an interconnect structure, wherein the first dielectric caps are a different material than the second dielectric caps. An additional embodiment may also include an interconnect structure, wherein the first dielectric caps have an etch selectivity of 10:1 or greater with respect to the second dielectric caps for a given etching process. An additional embodiment may also include an interconnect structure, further comprising one or more first through vias formed through the ILD, wherein a first dielectric cap is formed above top surfaces of the one or more first through vias. An additional embodiment may also include an interconnect structure, further comprising one or more second through vias formed through the ILD, wherein a second dielectric cap is formed above top surfaces of the one or more second through vias. An additional embodiment may also include an interconnect structure, wherein the first and An additional embodiment may also include an interconnect structure, wherein the etchstop liner is an aluminum-oxide or a hafnium-oxide material. An additional embodiment may also include an interconnect structure, wherein the first interconnect lines are spaced less than 25 nm from the second interconnect lines.

Embodiments of the invention may also include a method of forming interconnects comprising: forming one or more first trenches into an interlayer dielectric (ILD); disposing a first metal into the one or more first trenches to form first interconnect lines; forming an etchstop liner over top surfaces of the first interconnect lines; forming first dielectric caps above the etchstop liner formed over the top surfaces of the first interconnect lines; forming one or more second trenches into the ILD in an alternating pattern with the first trenches; disposing a second metal into the one or more second trenches to form second interconnect lines; forming an etchstop liner over top surfaces of the second interconnect lines and over top surfaces of the first dielectric caps; and forming second dielectric caps above the second interconnect lines. An additional embodiment may also include a method of forming interconnects, wherein forming the first trenches comprises: forming a backbone layer above a first hardmask layer formed over the ILD; forming spacers on the backbone layer, wherein a portion of the first hardmask layer remains exposed between the spacers; and etching through the exposed portions of the first hardmask layer and into the ILD underneath the exposed portions of the first hardmask layer. An additional embodiment may also include a method of forming interconnects, wherein forming the second trench comprises: etching through the backbone layer; and etching through portions of the first hardmask layer and into the ILD. An additional embodiment may also include a method of forming interconnects, further comprising: etching through portions of the ILD formed underneath one or more of the first trenches prior to disposing the first metal into the first trenches; and etching through portions of the ILD underneath one or more of the second trenches prior to disposing the second metal into the second trenches. An additional embodiment may also include a method of forming interconnects, wherein the etchstop liner has an etch selectivity of 10:1 or greater with respect to the first dielectric caps and the second dielectric caps. An additional embodiment may also include a method of forming interconnects, wherein the first interconnect lines are spaced apart from the second interconnect lines by less than 25 nm. An additional embodiment may also include a method of forming interconnects, wherein the first and second caps are a $SiO_xC_yN_z$ material, a metal oxide material, or a metal nitride material, and wherein the etchstop liner is an aluminum-oxide or a hafnium-oxide material.

Embodiments of the invention may also include a method of forming interconnects comprising: forming a first hardmask layer above an interlayer dielectric (ILD); forming a backbone hardmask above the first hardmask layer; forming a spacer layer over the surfaces of the backbone hardmask and the exposed portions of the first hardmask layer; etching through the spacer layer to form backbone spacers along the sidewalls of the backbone hardmask; etching through the first hardmask layer and the ILD to form first trenches into the ILD; disposing a first metal into the one or more first trenches to form first interconnect lines; forming an etchstop liner over top surfaces of the first interconnect lines; forming first dielectric caps above the etchstop liner formed over the top surfaces of the first interconnect lines; etching through the backbone hardmask, and the portions of the first hardmask layer and the ILD below the backbone hardmask to form second trenches; disposing a second metal into the one or more second trenches to form second interconnect lines; forming an etchstop liner over top surfaces of the second interconnect lines and over top surfaces of the first dielectric caps; forming second dielectric caps above the second interconnect lines; and removing the backbone spacers. An additional embodiment may also include a method of forming interconnects, wherein the etchstop liner has an etch selectivity of 10:1 or greater with respect to the first dielectric caps and the second dielectric caps during an etchstop liner etching process. An additional embodiment may also include a method of forming interconnects, wherein the etchstop liner etching process is a wet etching process. An additional embodiment may also include a method of forming interconnects An additional embodiment may also include a method of forming interconnects, wherein the first and second dielectric caps are a $SiO_xC_yN_z$ material, a metal oxide material, or a metal nitride material, and wherein the etchstop liner is an aluminum-oxide or a hafnium-oxide material.

What is claimed is:
1. An interconnect structure comprising:
an interlayer dielectric (ILD) with a first hardmask layer over a top surface of the ILD;
one or more first interconnect lines in the ILD, wherein a first dielectric cap is above a top surface of each of the first interconnect lines, and wherein a top surface of the first dielectric cap is substantially coplanar with a top surface of the first hardmask;
one or more second interconnect lines in the ILD arranged in an alternating pattern with the first interconnect lines, wherein a second dielectric cap is above a top surface of each of the second interconnect lines; and
an etchstop liner over top surfaces of the first dielectric caps.

2. The interconnect structure of claim 1, wherein the etchstop liner separates the first dielectric caps from the first interconnect lines.

3. The interconnect structure of claim 1, wherein the etchstop liner separates the second dielectric caps from the second interconnect lines, and wherein the etchstop liner is also formed along sidewalls of the second dielectric caps and over the top surface of the first hardmask layer.

4. The interconnect structure of claim 1, wherein the etchstop liner is formed over a top surface of the second dielectric caps.

5. The interconnect structure of claim 1, wherein the etchstop liner is a material that has an etch selectivity of 10:1 or greater with respect to the first dielectric caps, the second dielectric caps, and the first hardmask layer during an etchstop liner etching process.

6. The interconnect structure of claim 5, wherein the etchstop liner etching process is a wet etching process.

7. The interconnect structure of claim 6, wherein a dry etching process selectively etches at least one of the first dielectric caps or the second dielectric caps.

8. The interconnect structure of claim 1, wherein the first dielectric caps are a different material than the second dielectric caps.

9. The interconnect structure of claim 8, wherein the first dielectric caps have an etch selectivity of 10:1 or greater with respect to the second dielectric caps for a given etching process.

10. The interconnect structure of claim 1, further comprising one or more first through vias formed through the ILD, wherein a first dielectric cap is formed above top surfaces of the one or more first through vias.

11. The interconnect structure of claim 1, further comprising one or more second through vias formed through the ILD, wherein a second dielectric cap is formed above top surfaces of the one or more second through vias.

12. The interconnect structure of claim 1, wherein the first and second caps are a $SiO_xC_yN_z$ material, a metal oxide material, or a metal nitride material.

13. The interconnect structure of claim 1, wherein the etchstop liner is an aluminum-oxide or a hafnium-oxide material.

14. The interconnect structure of claim 1, wherein the first interconnect lines are spaced less than 25 nm from the second interconnect lines.

15. A method of forming interconnects comprising:
forming one or more first trenches into an interlayer dielectric (ILD);
disposing a first metal into the one or more first trenches to form first interconnect lines;
forming an etchstop liner over top surfaces of the first interconnect lines;
forming first dielectric caps above the etchstop liner formed over the top surfaces of the first interconnect lines;
forming one or more second trenches into the ILD in an alternating pattern with the first trenches;
disposing a second metal into the one or more second trenches to form second interconnect lines;
forming an etchstop liner over top surfaces of the second interconnect lines and over top surfaces of the first dielectric caps; and
forming second dielectric caps above the second interconnect lines.

16. The method of claim 15, wherein forming the first trenches comprises:
forming a backbone layer above a first hardmask layer formed over the ILD;
forming spacers on the backbone layer, wherein a portion of the first hardmask layer remains exposed between the spacers; and
etching through the exposed portions of the first hardmask layer and into the ILD underneath the exposed portions of the first hardmask layer.

17. The method of claim 16, wherein forming the second trench comprises:
etching through the backbone layer; and
etching through portions of the first hardmask layer and into the ILD.

18. The method of claim 15, further comprising:
etching through portions of the ILD formed underneath one or more of the first trenches prior to disposing the first metal into the first trenches; and
etching through portions of the ILD underneath one or more of the second trenches prior to disposing the second metal into the second trenches.

19. The method of claim 15, wherein the etchstop liner has an etch selectivity of 10:1 or greater with respect to the first dielectric caps and the second dielectric caps.

20. The method of claim 15, wherein the first interconnect lines are spaced apart from the second interconnect lines by less than 25 nm.

21. The method of claim 15, wherein the first and second caps are a $SiO_xC_yN_z$ material, a metal oxide material, or a metal nitride material, and wherein the etchstop liner is an aluminum-oxide or a hafnium-oxide material.

22. A method of forming interconnects comprising:
forming a first hardmask layer above an interlayer dielectric (ILD);
forming a backbone hardmask above the first hardmask layer;
forming a spacer layer over the surfaces of the backbone hardmask and the exposed portions of the first hardmask layer;
etching through the spacer layer to form backbone spacers along the sidewalls of the backbone hardmask;
etching through the first hardmask layer and the ILD to form first trenches into the ILD;
disposing a first metal into the one or more first trenches to form first interconnect lines;
forming an etchstop liner over top surfaces of the first interconnect lines;
forming first dielectric caps above the etchstop liner formed over the top surfaces of the first interconnect lines;
etching through the backbone hardmask, and the portions of the first hardmask layer and the ILD below the backbone hardmask to form second trenches;
disposing a second metal into the one or more second trenches to form second interconnect lines;
forming an etchstop liner over top surfaces of the second interconnect lines and over top surfaces of the first dielectric caps;
forming second dielectric caps above the second interconnect lines; and
removing the backbone spacers.

23. The method of claim 22, wherein the etchstop liner has an etch selectivity of 10:1 or greater with respect to the first dielectric caps and the second dielectric caps during an etchstop liner etching process.

24. The method of claim 23, wherein the etchstop liner etching process is a wet etching process.

25. The method of claim 22, wherein the first and second dielectric caps are a $SiO_xC_yN_z$ material, a metal oxide material, or a metal nitride material, and wherein the etchstop liner is an aluminum-oxide or a hafnium-oxide material.

* * * * *